United States Patent
Pao et al.

(10) Patent No.: US 12,249,636 B2
(45) Date of Patent: Mar. 11, 2025

(54) TUNING GATE LENGTHS IN MULTI-GATE FIELD EFFECT TRANSISTORS

(71) Applicant: Taiwan Semiconductor Manufacturing Company, Ltd., Hsin-Chu (TW)

(72) Inventors: Chia-Hao Pao, Kaohsiung (TW); Chih-Chuan Yang, Hsinchu (TW); Shih-Hao Lin, Hsinchu (TW); Kian-Long Lim, Hsinchu (TW); Chih-Hsuan Chen, Hsinchu (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 503 days.

(21) Appl. No.: 17/548,133

(22) Filed: Dec. 10, 2021

(65) Prior Publication Data

US 2022/0344484 A1    Oct. 27, 2022

Related U.S. Application Data

(60) Provisional application No. 63/178,725, filed on Apr. 23, 2021.

(51) Int. Cl.
*H01L 29/423* (2006.01)
*H01L 21/265* (2006.01)
(Continued)

(52) U.S. Cl.
CPC .. *H01L 29/42392* (2013.01); *H01L 21/26513* (2013.01); *H01L 21/308* (2013.01);
(Continued)

(58) Field of Classification Search
CPC ........... H01L 29/42392; H01L 29/0665; H01L 29/401; H01L 29/41775; H01L 29/66553; H01L 29/78696; H01L 29/0673; H01L 29/66439; H01L 29/66545; H01L 29/42376; H01L 29/66795;
(Continued)

(56) References Cited

U.S. PATENT DOCUMENTS 8,772,109 B2    7/2014  Colinge
8,785,285 B2    7/2014  Tsai et al.
(Continued)

*Primary Examiner* — Fernando L Toledo
*Assistant Examiner* — Marshall Mu-Nuo Hatfield
(74) *Attorney, Agent, or Firm* — HAYNES AND BOONE, LLP

(57) ABSTRACT

A method includes providing a substrate having a first region and a second region, forming a fin protruding from the first region, where the fin includes a first SiGe layer and a stack alternating Si layers and second SiGe layers disposed over the first SiGe layer and the first SiGe layer has a first concentration of Ge and each of the second SiGe layers has a second concentration of Ge that is greater than the first concentration, recessing the fin to form an S/D recess, recessing the first SiGe layer and the second SiGe layers exposed in the S/D recess, where the second SiGe layers are recessed more than the first SiGe layer, forming an S/D feature in the S/D recess, removing the recessed first SiGe layer and the second SiGe layers to form openings, and forming a metal gate structure over the fin and in the openings.

20 Claims, 36 Drawing Sheets

(51) Int. Cl.
*H01L 21/308* (2006.01)
*H01L 29/06* (2006.01)
*H01L 29/40* (2006.01)
*H01L 29/417* (2006.01)
*H01L 29/66* (2006.01)
*H01L 29/786* (2006.01)

(52) U.S. Cl.
CPC ........ *H01L 29/0665* (2013.01); *H01L 29/401* (2013.01); *H01L 29/41775* (2013.01); *H01L 29/66553* (2013.01); *H01L 29/78696* (2013.01)

(58) Field of Classification Search
CPC ............. H01L 29/42356; H01L 29/785; H01L 21/26513; H01L 21/308; H01L 21/41775; H01L 21/26506; C23C 16/04–047
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,548,386 | B1 * | 1/2017 | Cheng .................. H01L 29/165 |
| 9,576,814 | B2 | 2/2017 | Wu et al. |
| 10,431,651 | B1 * | 10/2019 | Chao .................. H01L 29/78696 |
| 10,872,906 | B2 * | 12/2020 | Hung .................. H01L 29/1054 |
| 2014/0370666 | A1 * | 12/2014 | Vinet .................. H01L 21/02236 438/151 |
| 2017/0076997 | A1 * | 3/2017 | Reboh .................. H01L 29/7846 |
| 2017/0309483 | A1 * | 10/2017 | Reboh .................. H01L 21/02381 |
| 2018/0005826 | A1 * | 1/2018 | Jacob .................. H01L 21/02532 |
| 2019/0214459 | A1 * | 7/2019 | Cheng .................. B82Y 10/00 |
| 2020/0105539 | A1 * | 4/2020 | Takahashi ......... H01L 21/67161 |
| 2020/0119015 | A1 * | 4/2020 | Bi ....................... H01L 29/7851 |

* cited by examiner

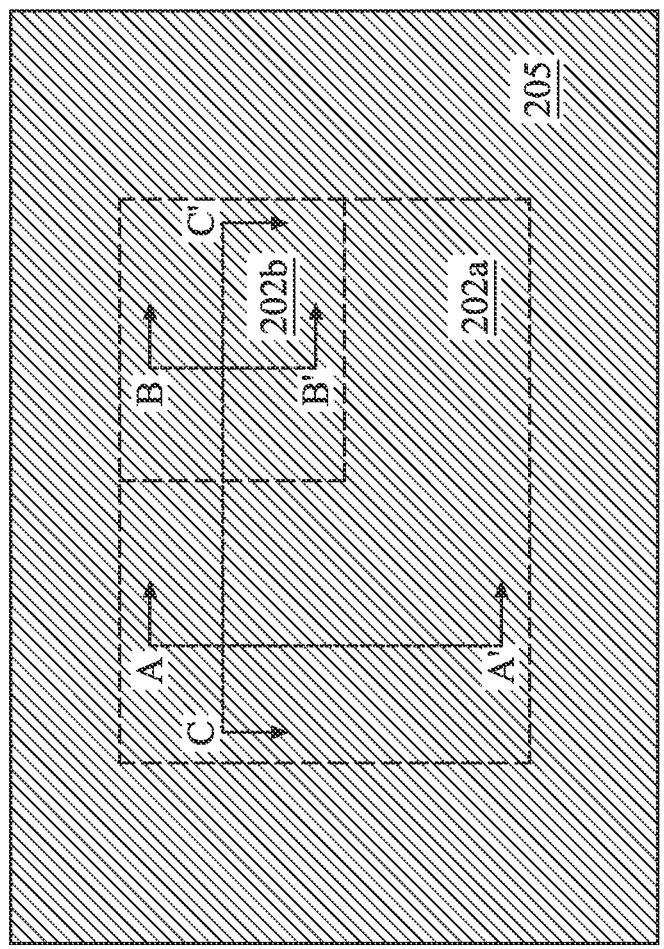
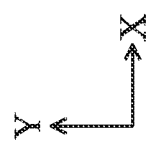
FIG. 2C

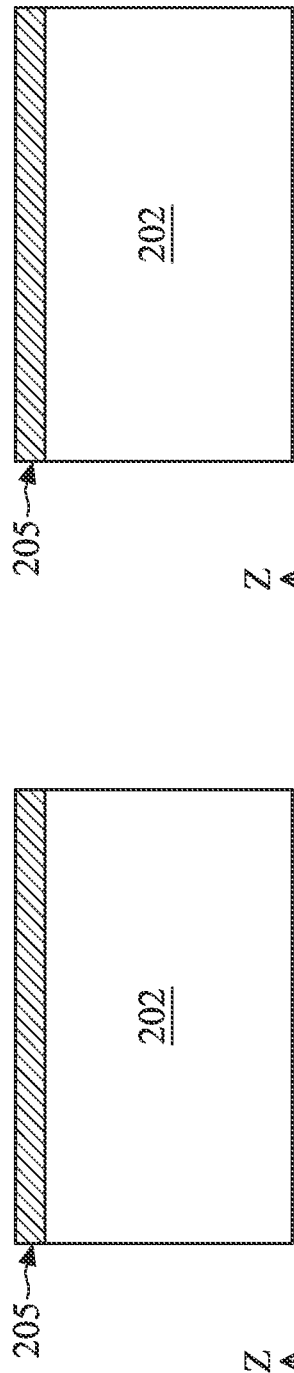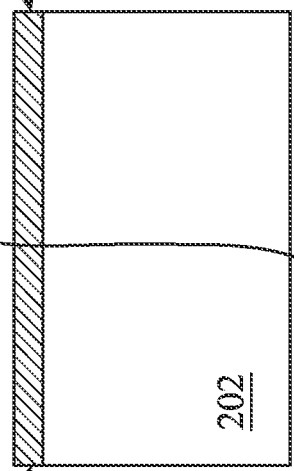
FIG. 3A  FIG. 3B  FIG. 3C

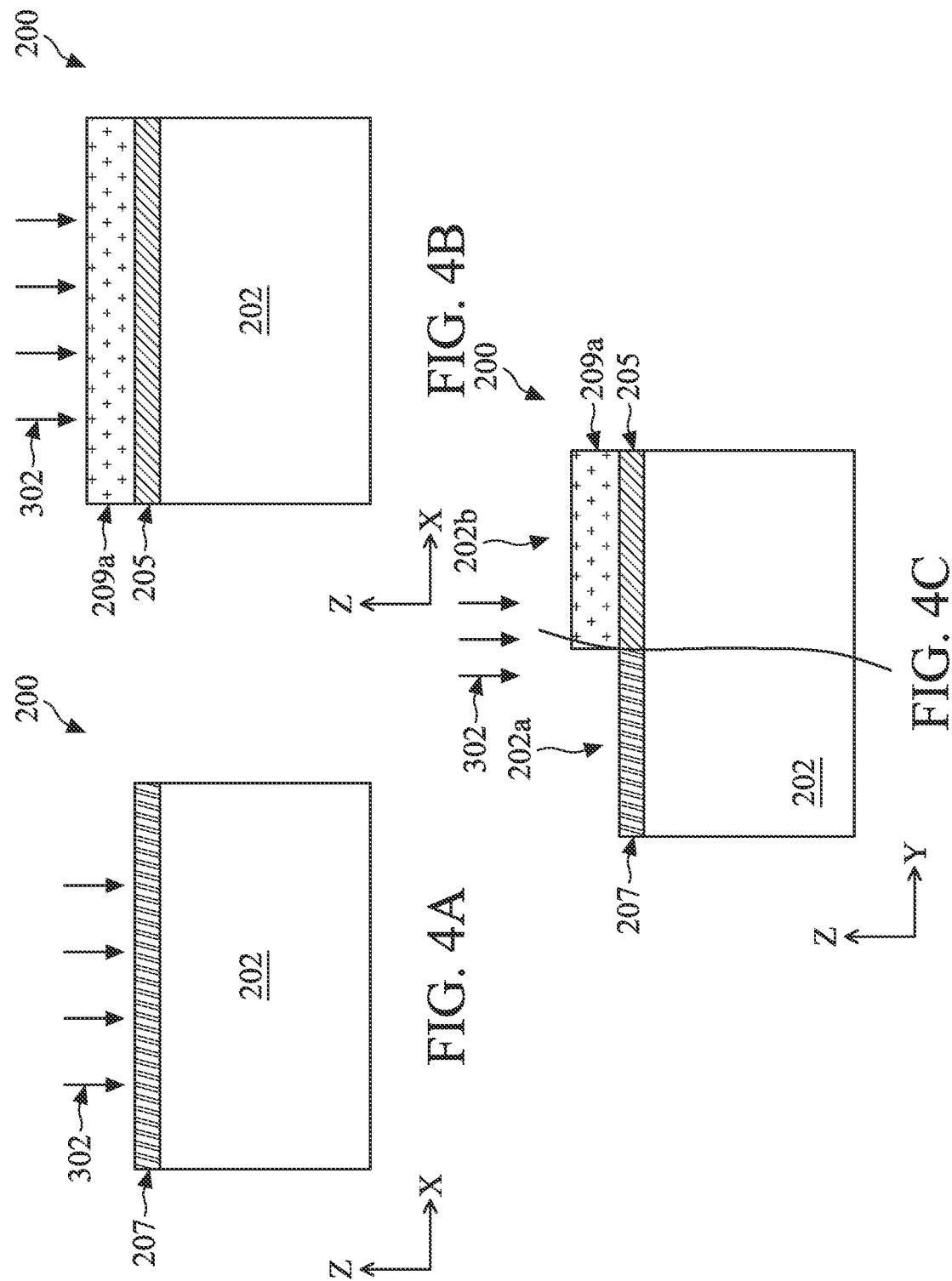

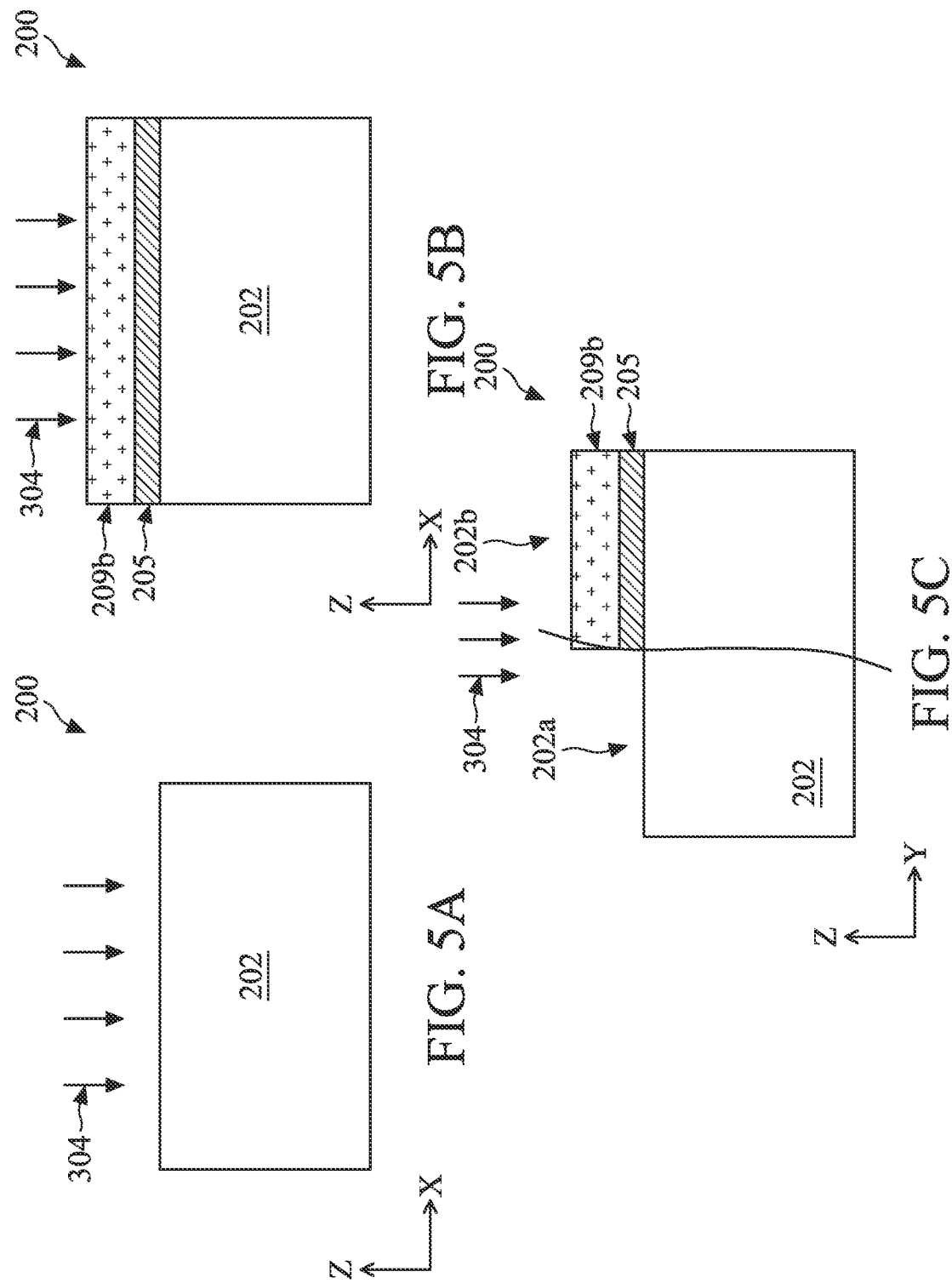

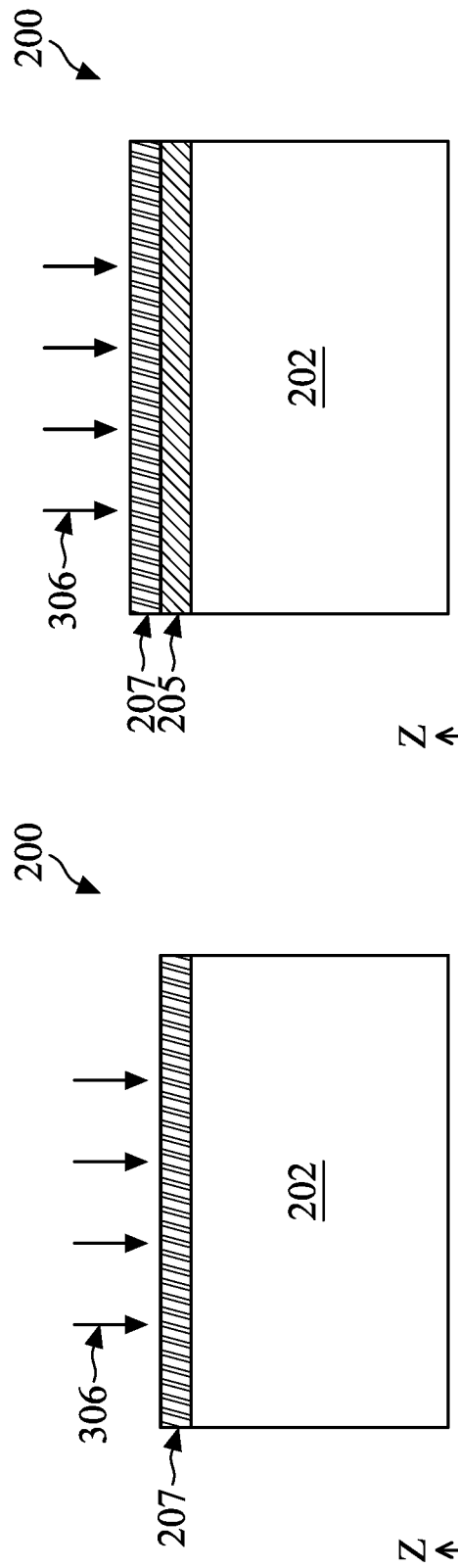
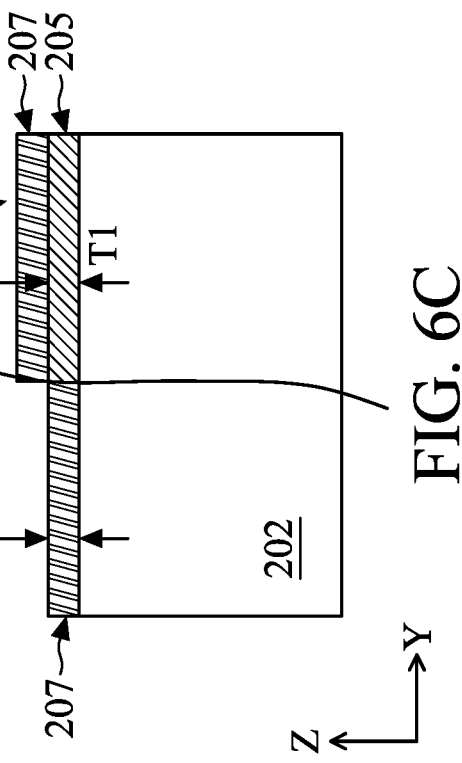
FIG. 6A
FIG. 6B
FIG. 6C

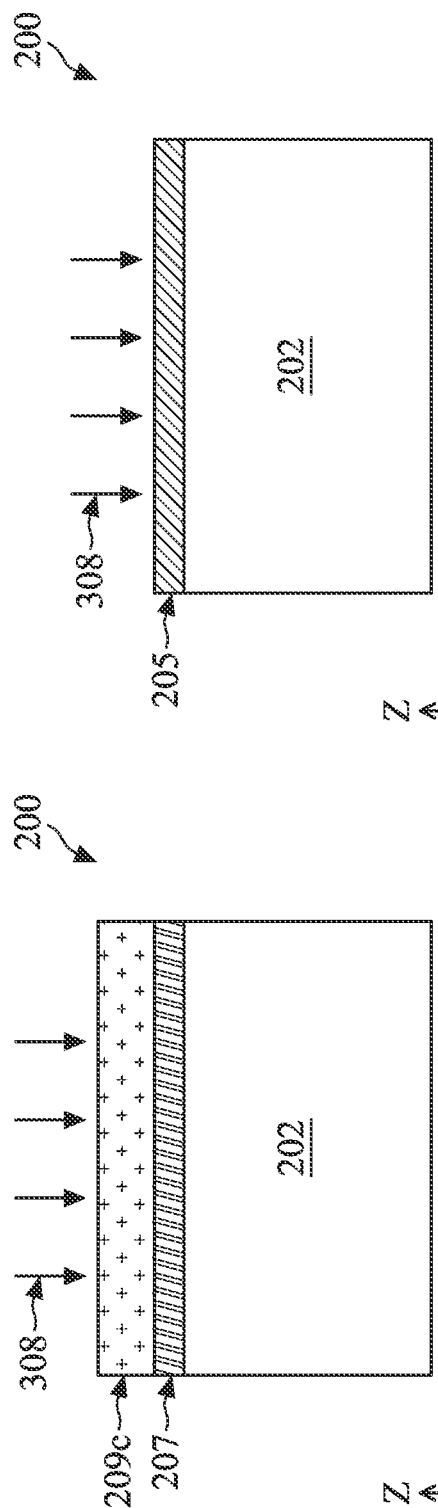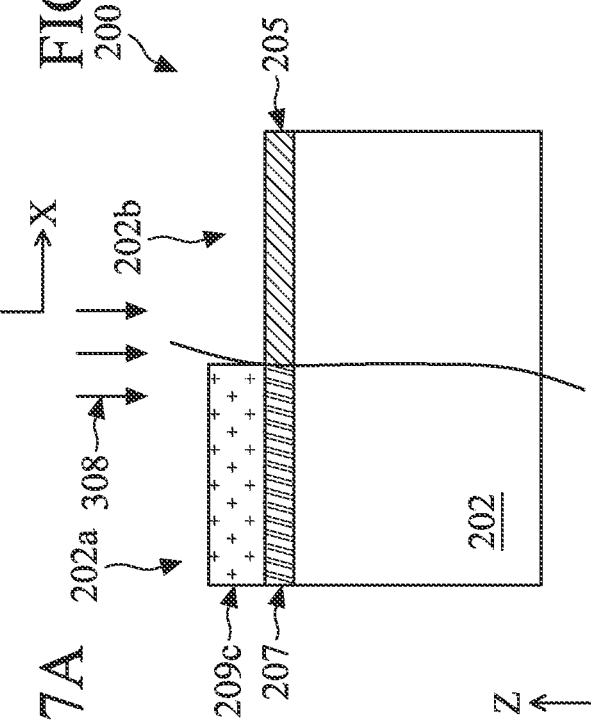

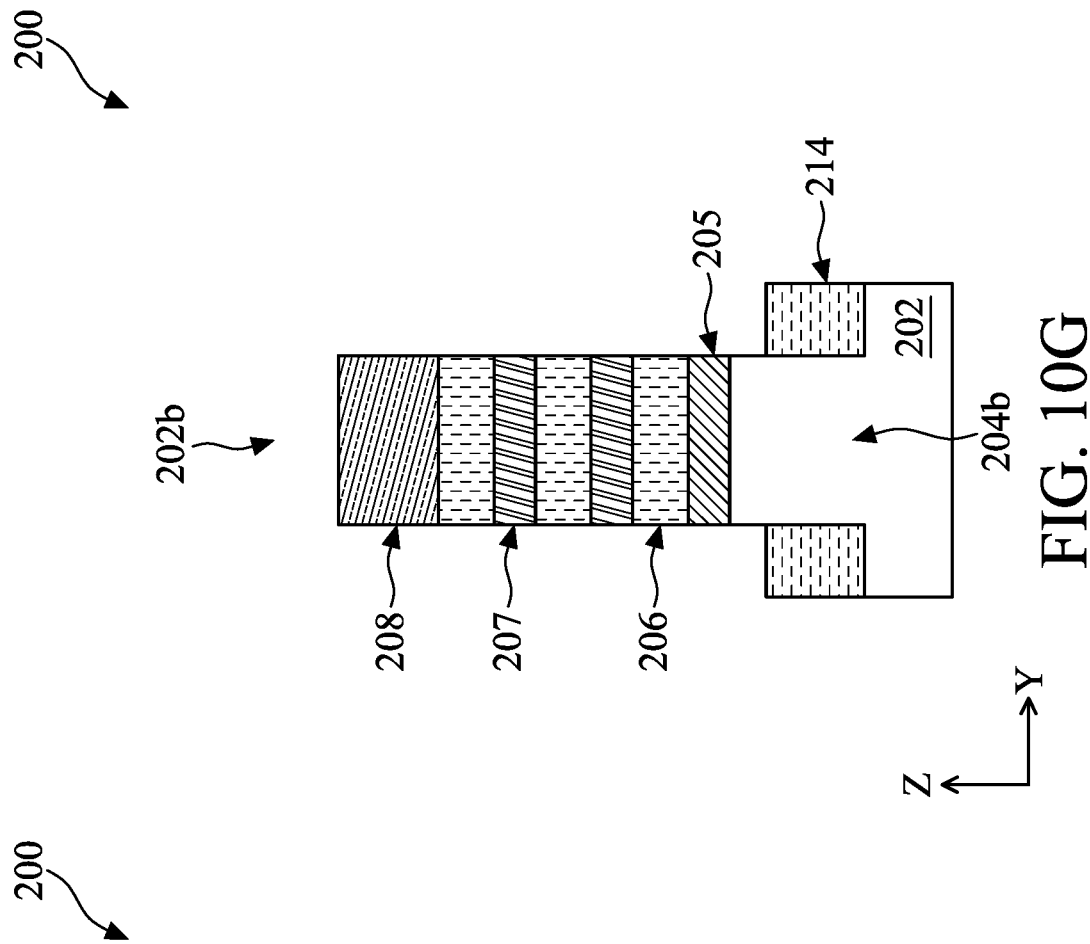
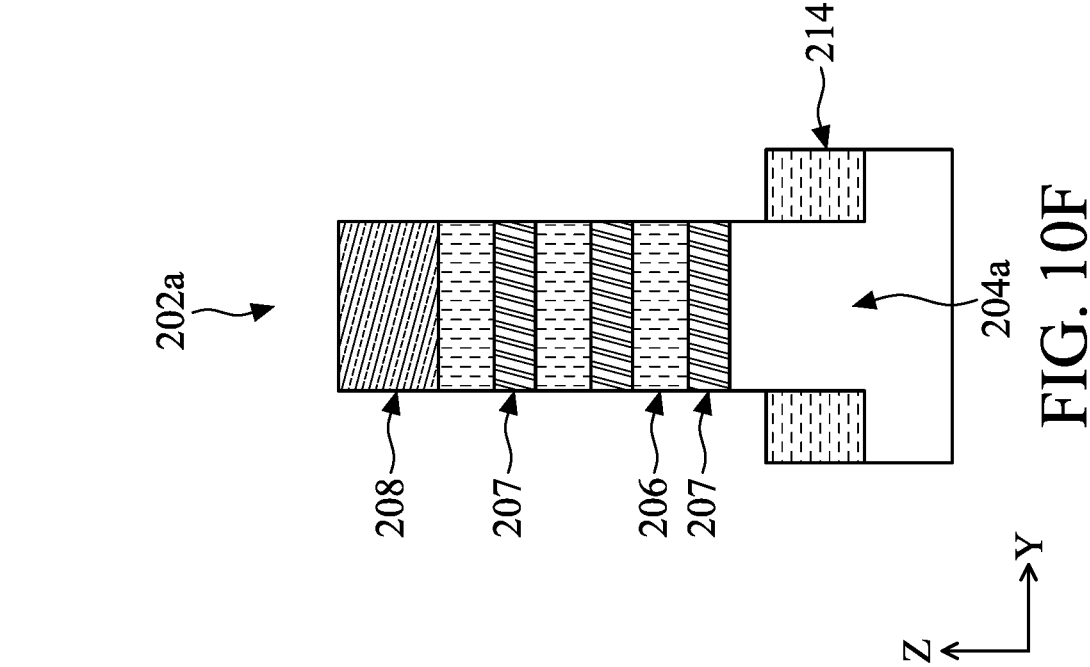

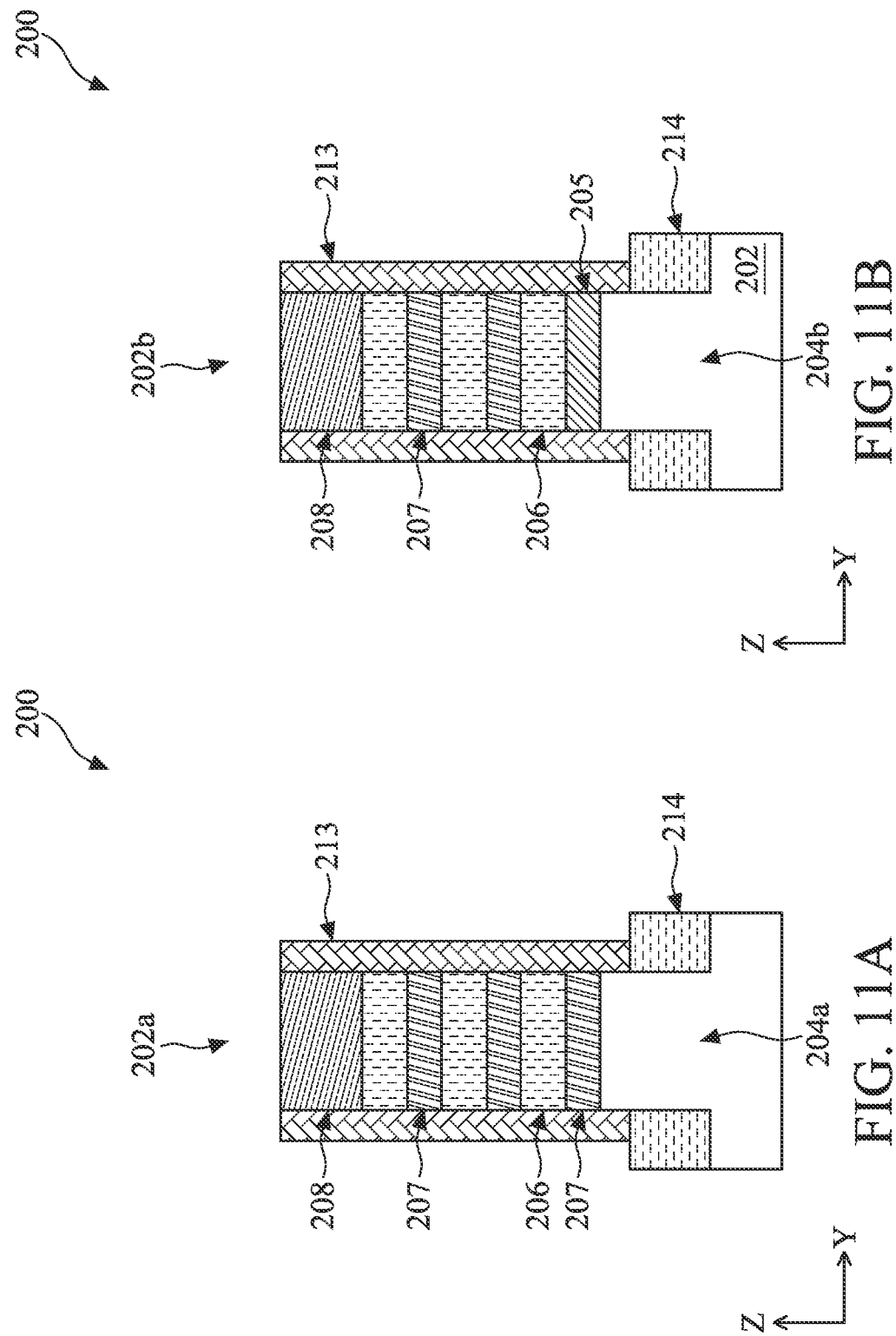

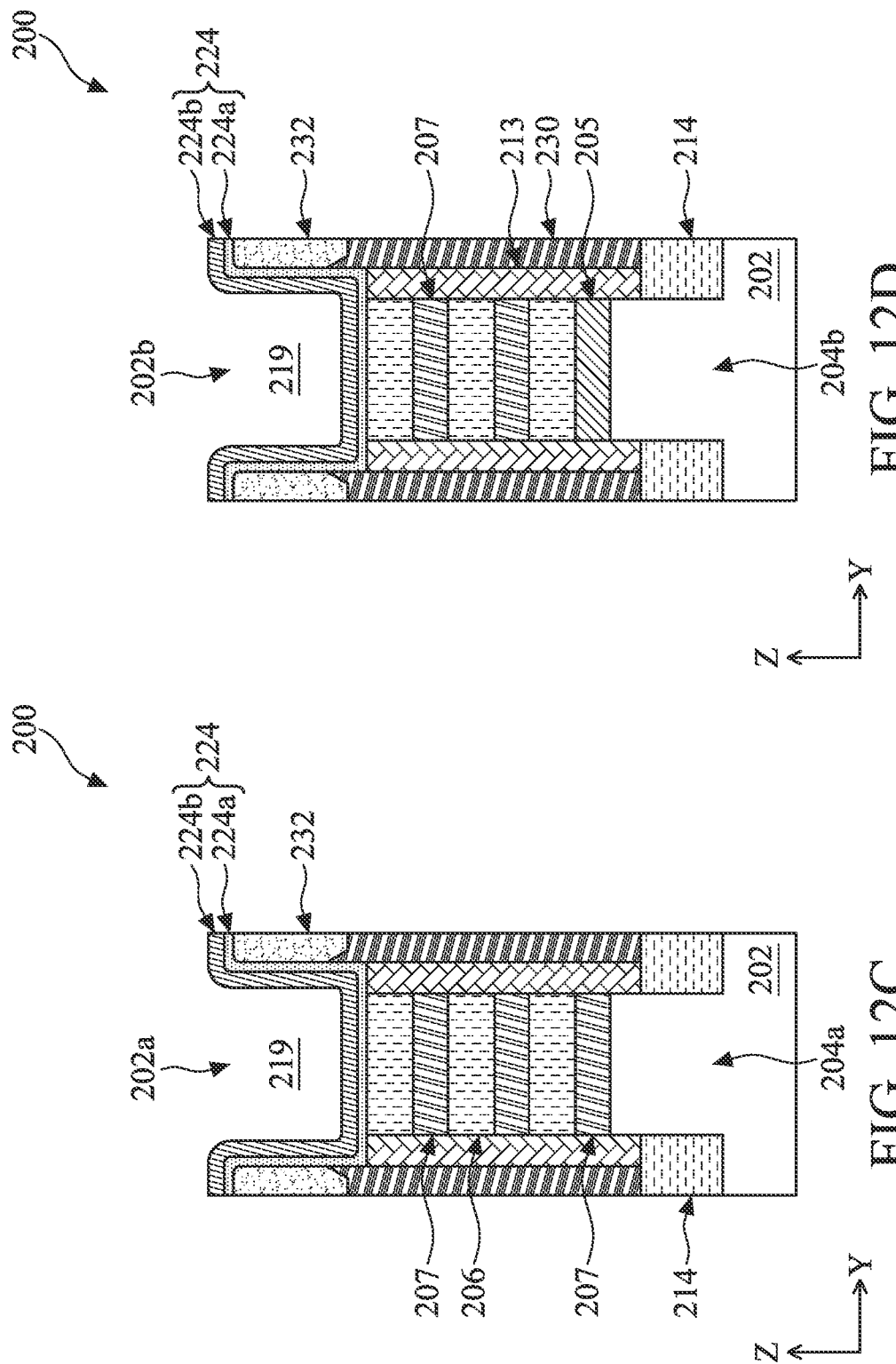

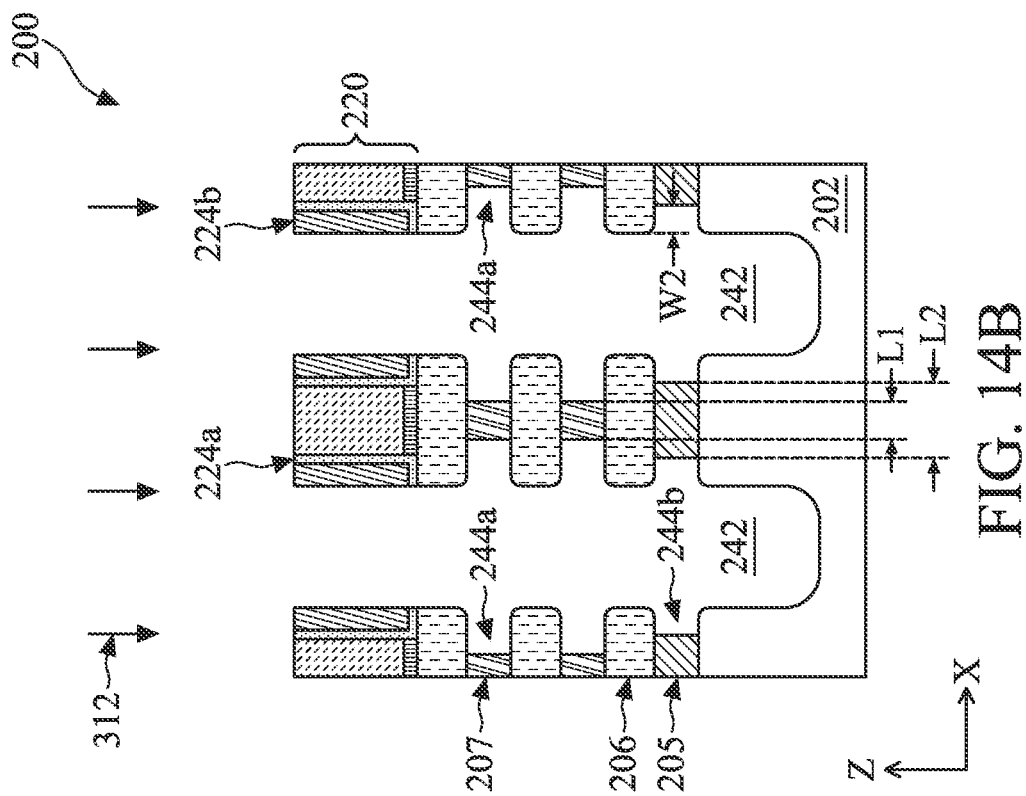
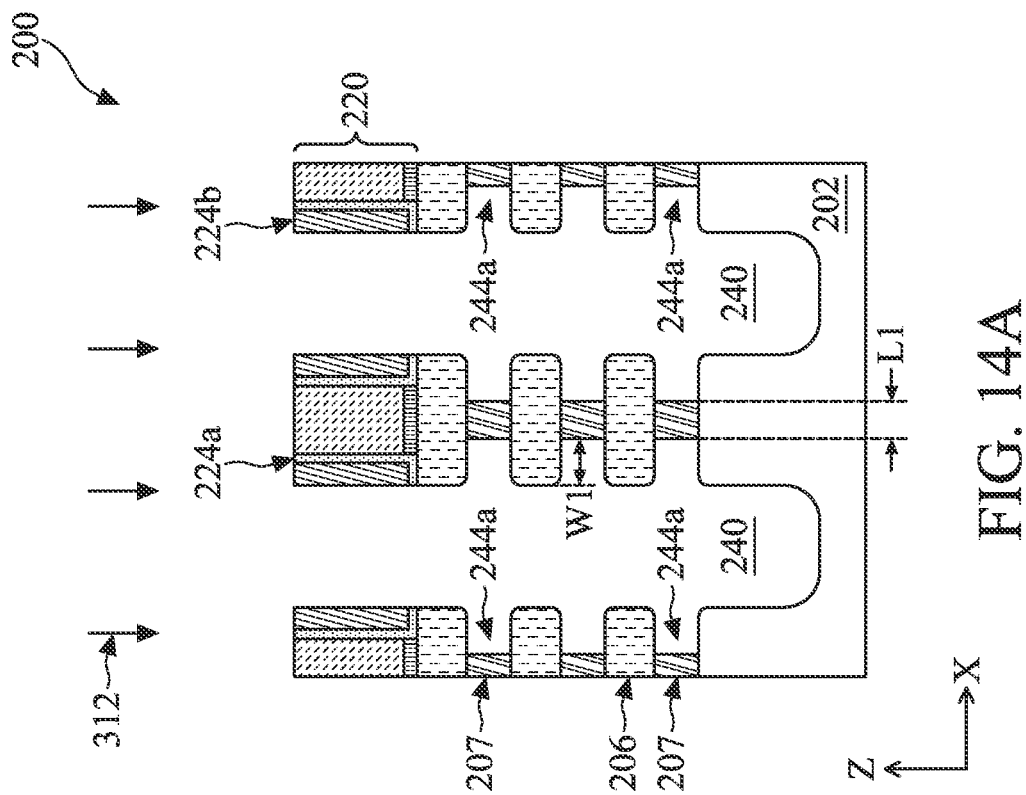
FIG. 14B
FIG. 14A

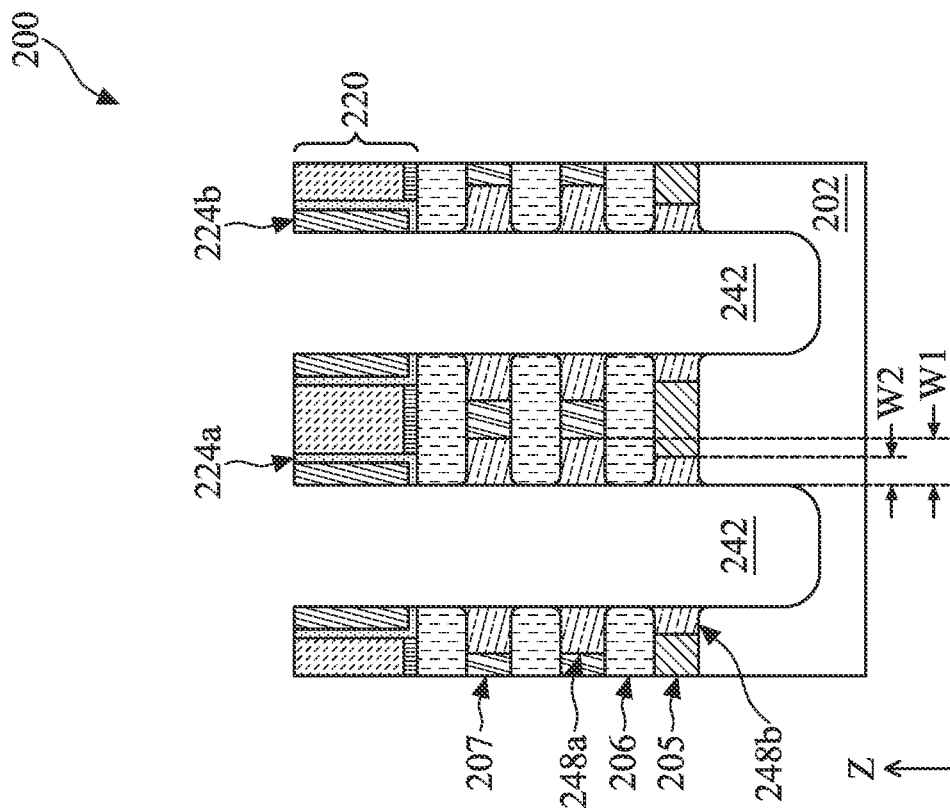
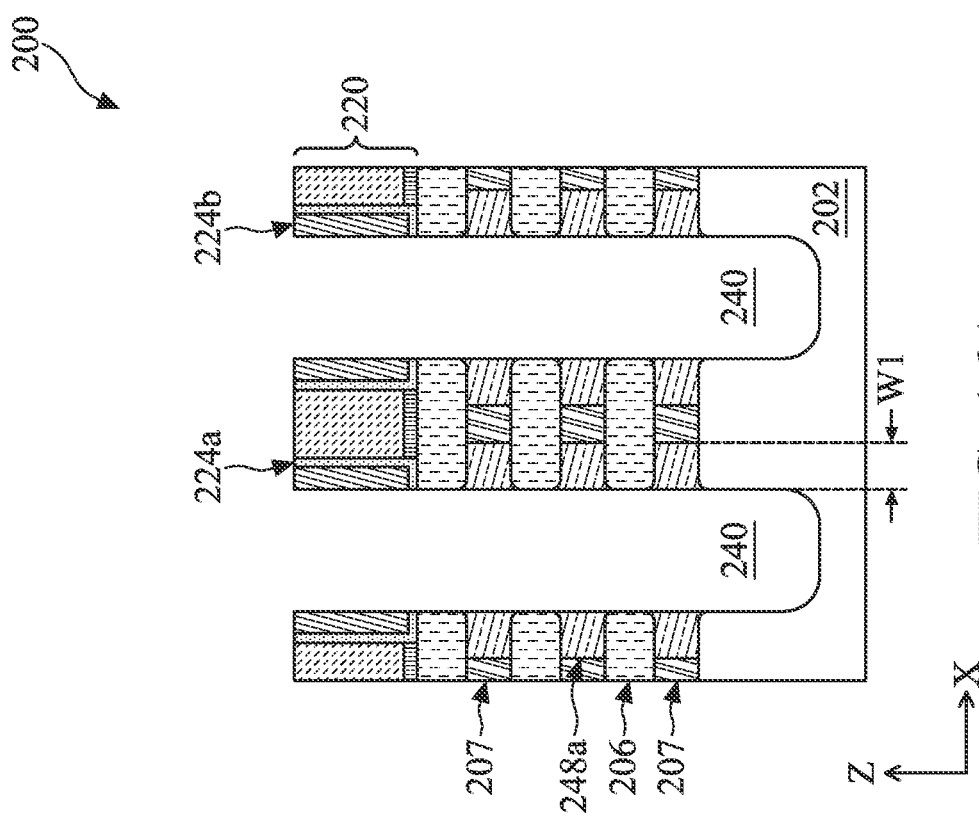

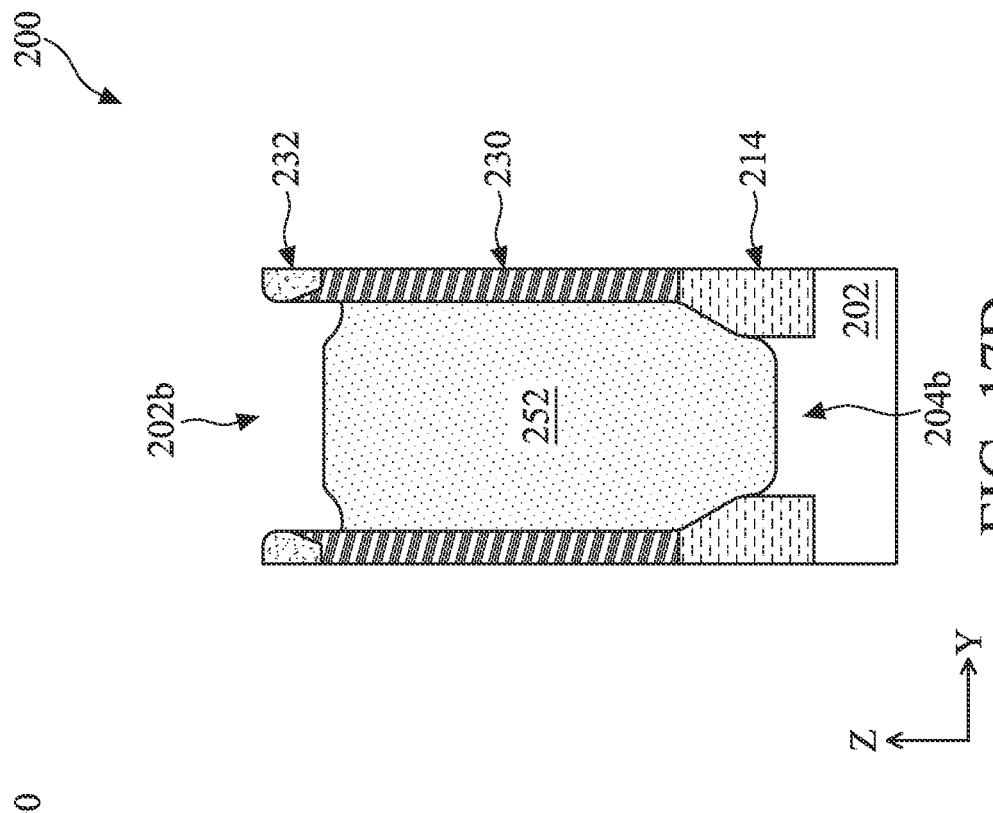
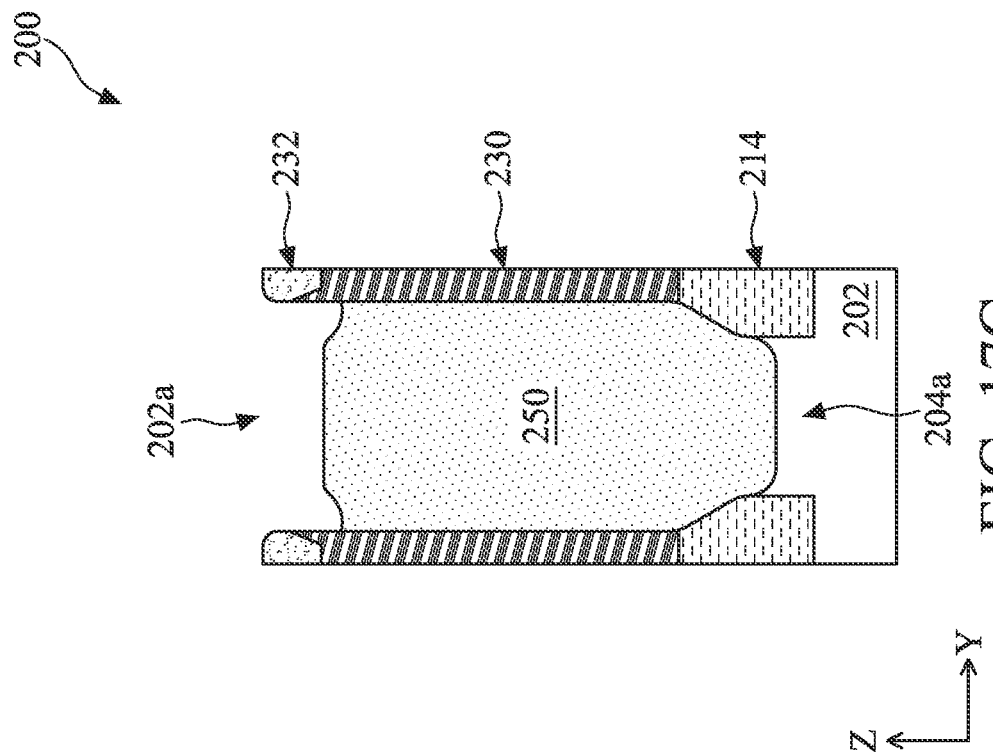

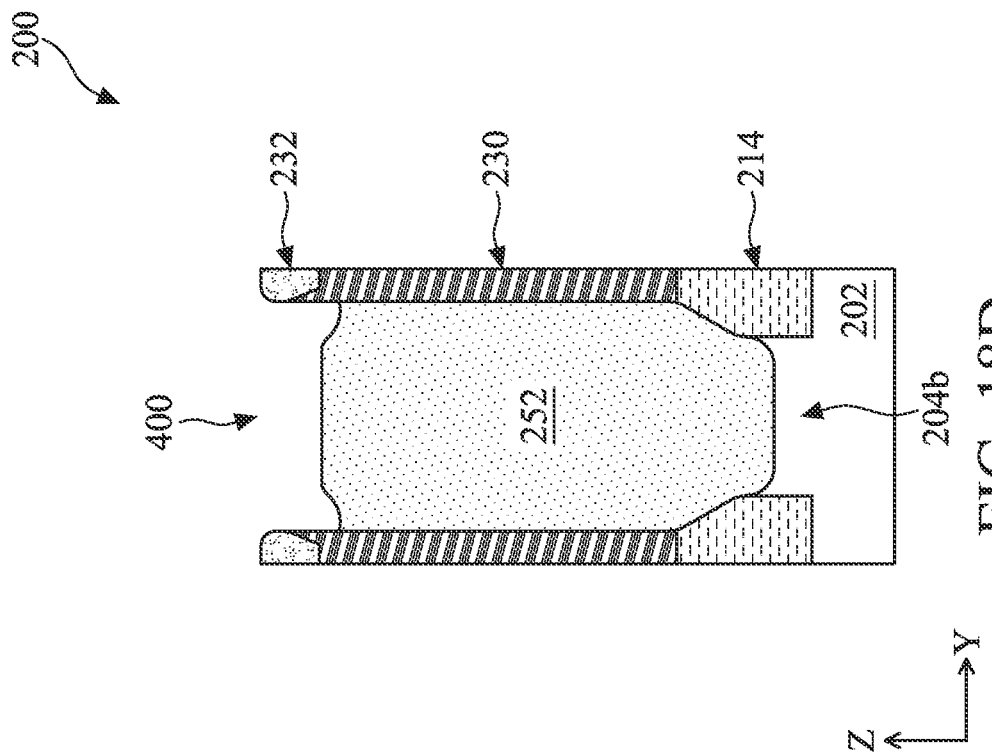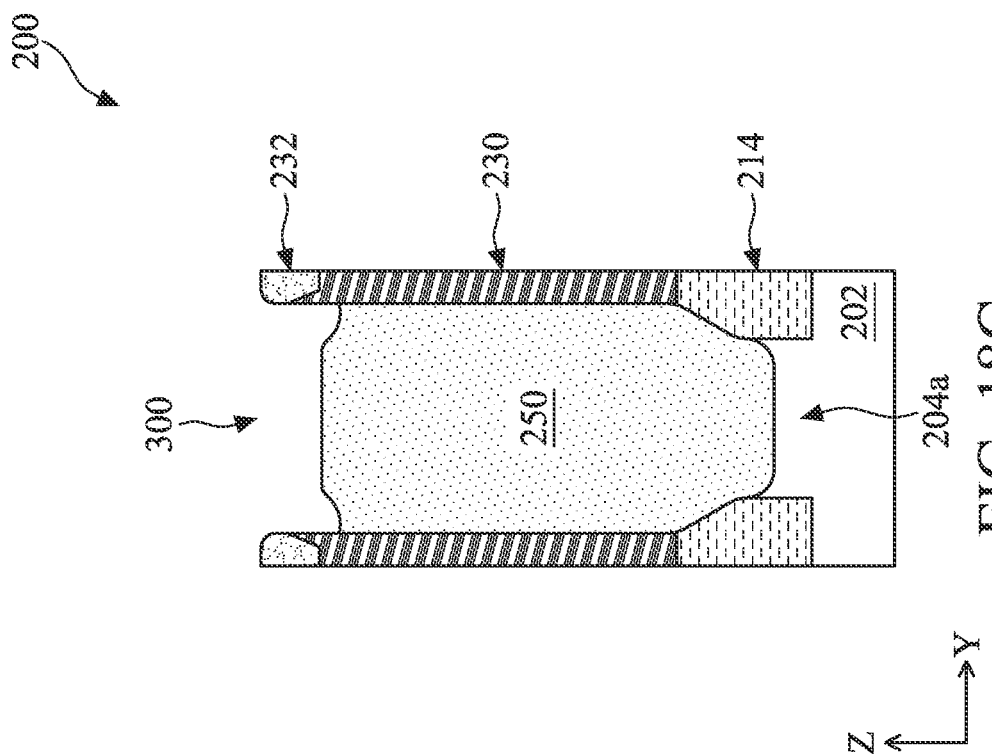

TUNING GATE LENGTHS IN MULTI-GATE FIELD EFFECT TRANSISTORS

CROSS-REFERENCE TO RELATED APPLICATIONS

This application claims priority to U.S. Provisional Application Ser. No. 63/178,725, filed Apr. 23, 2021 and titled "Tuning Gate Lengths in Multi-Gate Field Effect Transistors," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, three-dimensional multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. A nanosheet field-effect transistor (NS FET; alternatively referred to as a gate-all-around, or GAA, FET) is an example of a multi-gate device. An NS FET generally includes a gate structure that can extend, partially or fully, around a channel region to provide access to the channel region on two or more sides. NS FETs with different configurations may be suitable for different circuit functions due to their different performance characteristics. While existing NS FETs and methods for forming NS FETs are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 10A, 10B, and 10C is are planar top views of a portion of an example semiconductor device according to various embodiments of the present disclosure.

FIGS. 3A, 4A, 5A, 6A, 7A, 8A, and 9A are cross-sectional views of the semiconductor device taken along line AA' as shown in FIG. 2A, 2B, or 2C during intermediate stages of the method shown in FIGS. 1A, 1B, and/or 1C according to various embodiments of the present disclosure.

FIGS. 3B, 4B, 5B, 6B, 7B, 8B, and 9B are cross-sectional views of the semiconductor device taken along line BB' as shown in FIG. 2A, 2B, or 2C during intermediate stages of the method shown in FIGS. 1A, 1B, and/or 1C according to various embodiments of the present disclosure.

FIGS. 3C, 4C, 5C, 6C, 7C, 8C, and 9C are cross-sectional views of the semiconductor device taken along line CC' as shown in FIG. 2A, 2B, or 2C during intermediate stages of the method shown in FIGS. 1A, 1B, and/or 1C according to various embodiments of the present disclosure.

FIGS. 10D, 12A, 13A, 14A, 15A, 16A, 17A, and 18A are cross-sectional views of the semiconductor device taken along line AA' as shown in FIG. 10A, 10B, or 10C during intermediate stages of the method shown in FIGS. 1A, 1B, and/or 1C according to various embodiments of the present disclosure.

FIGS. 10E, 12B, 13B, 14B, 15B, 16B, 17B, and 18B are cross-sectional views of the semiconductor device taken along line BB' as shown in FIG. 10A, 10B, or 10C during intermediate stages of the method shown in FIGS. 1A, 1B, and/or 1C according to various embodiments of the present disclosure.

FIGS. 10F, 11A, 12C, 13C, 14C, 15C, 16C, 17C, and 18C are cross-sectional views of the semiconductor device taken along line DD' as shown in FIG. 10A, 10B, or 10C during intermediate stages of the method shown in FIGS. 1A, 1B, and/or 1C according to various embodiments of the present disclosure.

FIGS. 10G, 11B, 12D, 13D, 14D, 15D, 16D, 17D, and 18D are cross-sectional views of the semiconductor device taken along line EE' as shown in FIG. 10A, 10B, or 10C during intermediate stages of the method shown in FIGS. 1A, 1B, and/or 1C according to various embodiments of the present disclosure.

DETAILED DESCRIPTION

Figure 1A:
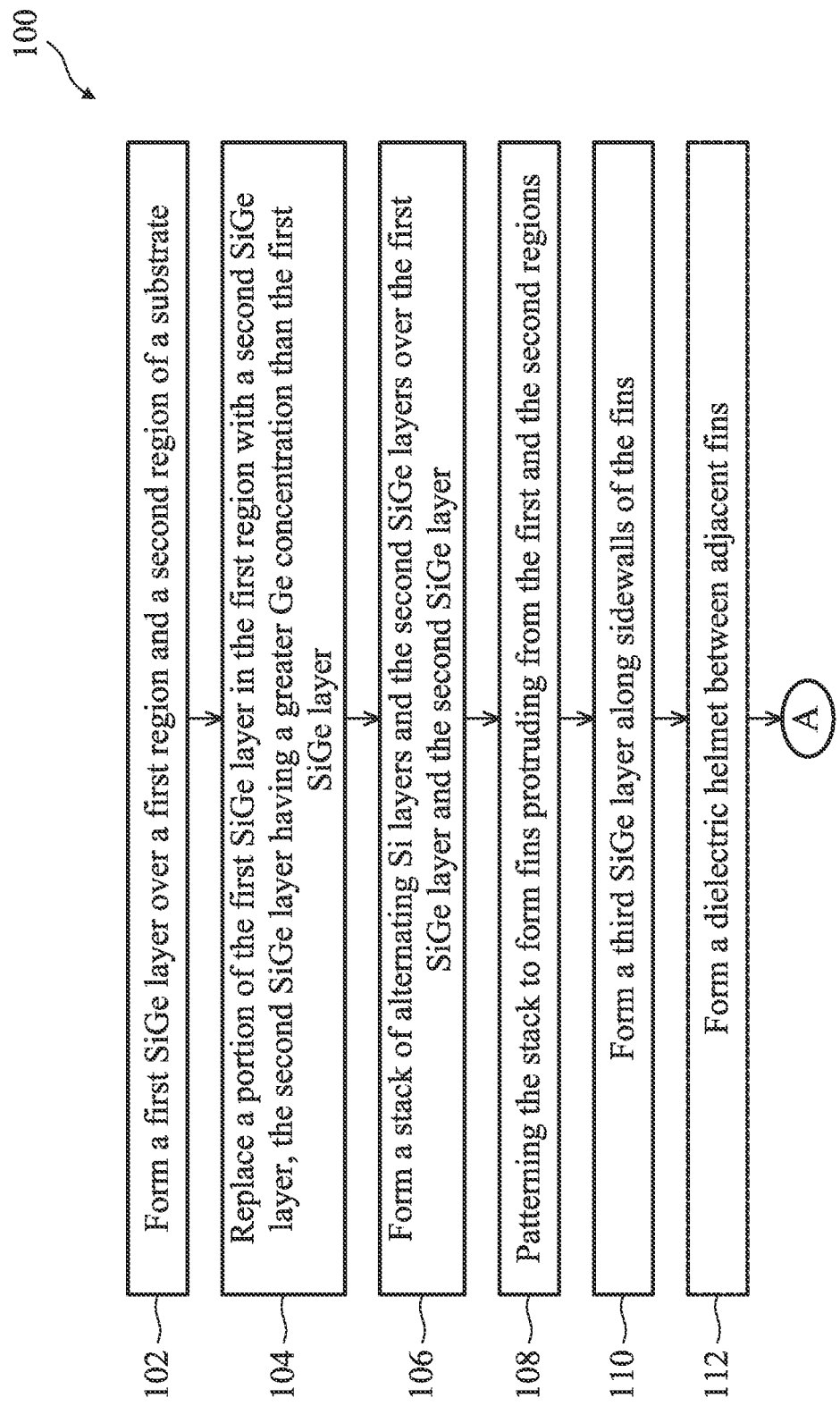
FIGS. 1A, 1B, and 1C illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional, multi-gate nano-structure (NS) FETs (alternatively referred to as gate-all-around, or GAA, FETs), in memory and/or standard logic cells of an integrated circuit (IC) structure. Generally, NS FETs are configured with a plurality of vertically stacked sheets (e.g., nanosheets), wires (e.g., nanowires), or rods (e.g., nanorods) as channel regions engaged with a metal gate stack, thereby allowing better gate control, lowered leakage current, and improved scaling capability for various IC applications. The present disclosure includes multiple embodiments. Different embodiments may have different advantages, and no particular advantage is necessarily required of any embodiment.

An NS FET may generally include a stack of channel layers (such as Si layers) disposed over an active region (e.g., a fin), source/drain (S/D) features formed over or in the active region, and a metal gate stack interleaved with the stack of channel layers and interposed between the S/D features. With rising demand for portable applications, devices with high speed and low power consumption become more crucial at reduced length scales. Existing GAA FETs generally have a one-sized gate length. While such devices have been generally adequate, they have not been entirely satisfactory in all aspects. For example, designing devices with tunable gate lengths may provide more flexibility in optimizing performance of memory cells (such as static random access memory, or SRAM, cells).

Figure 1B:
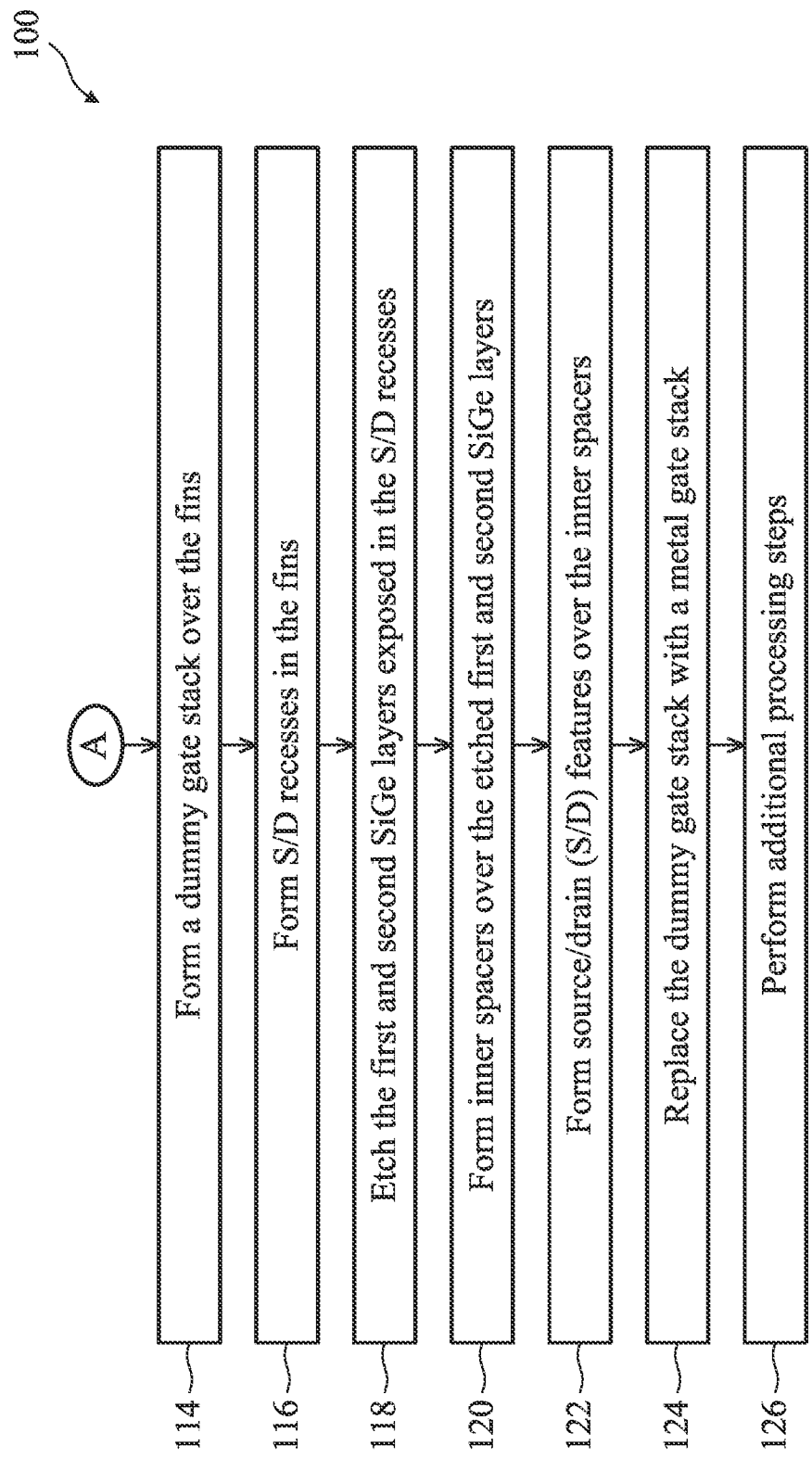
Figure 1C:
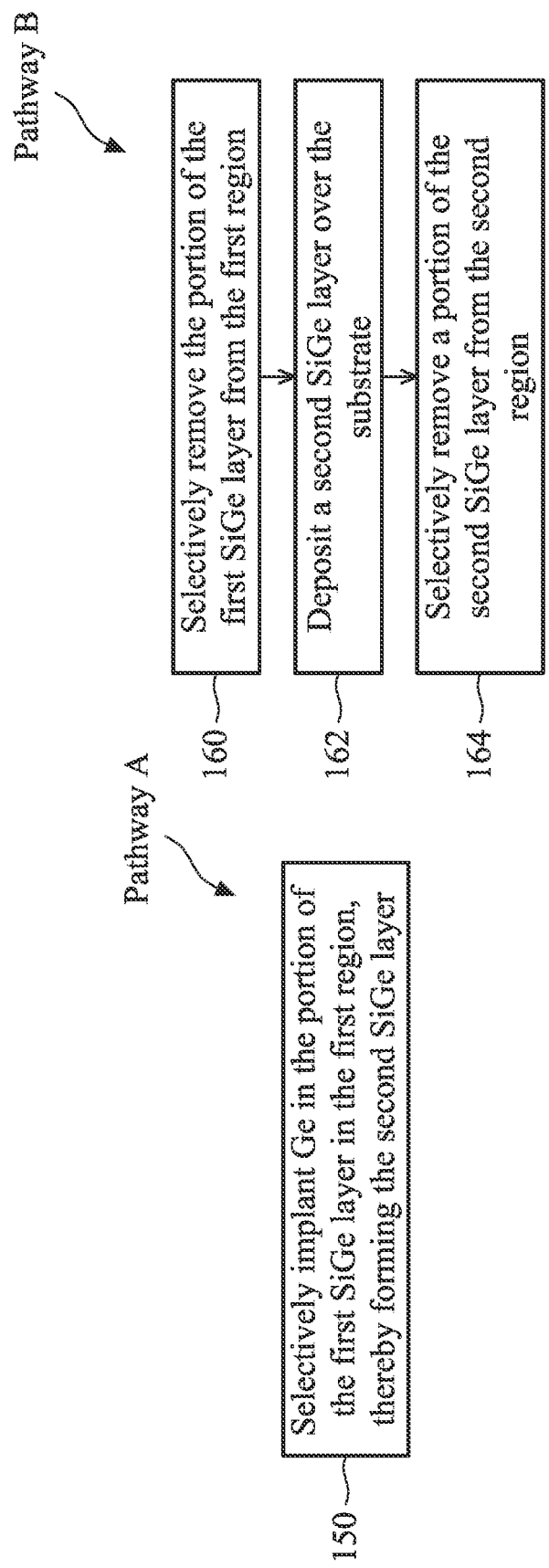
Figure 2A:
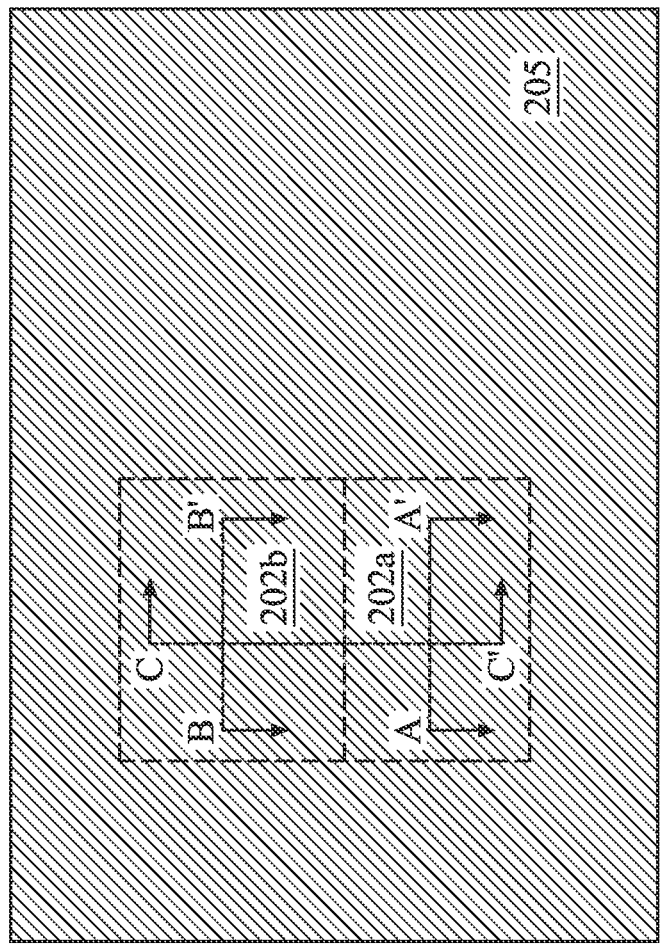
Figure 2B:
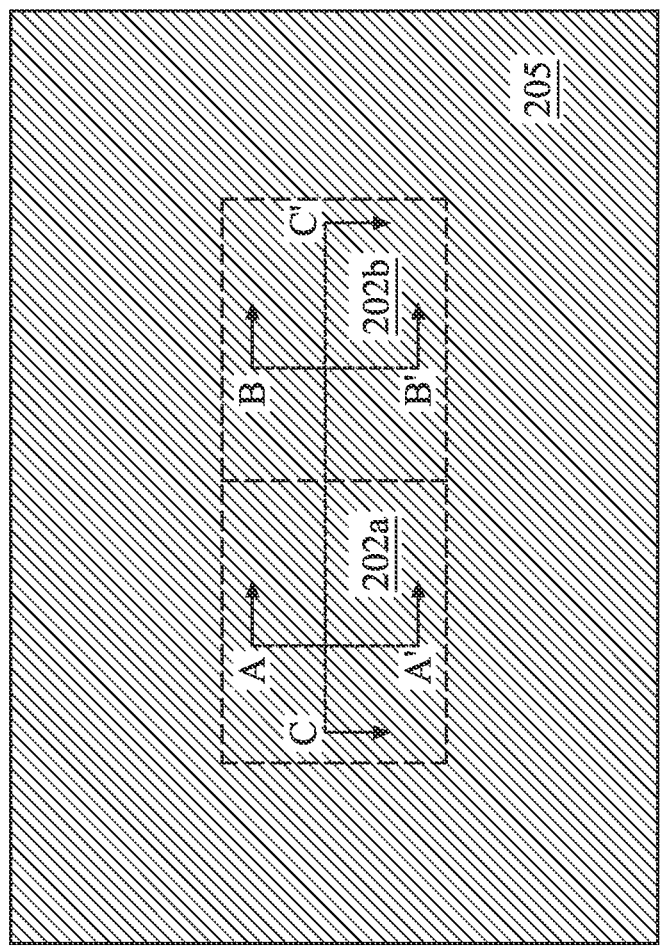
Figure 8A:
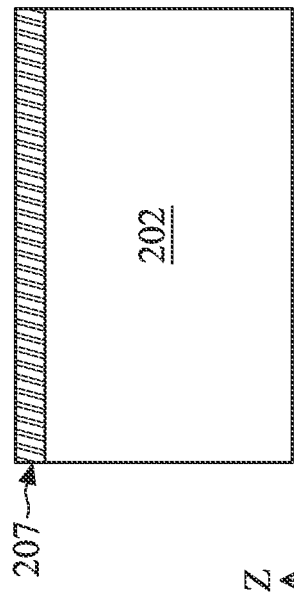
Figure 8B:
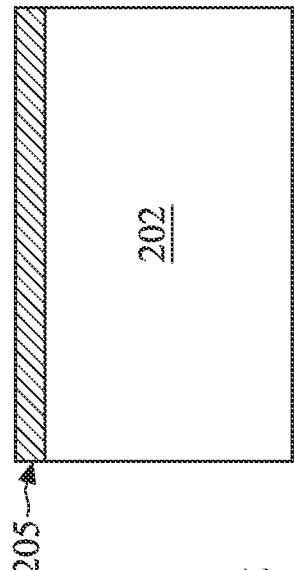
Figure 8C:
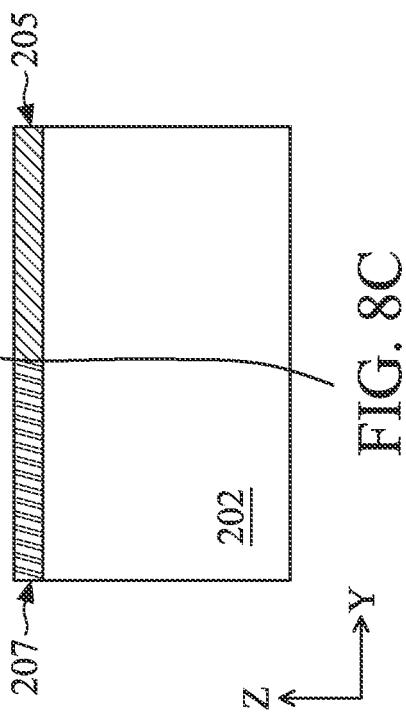
Figure 9B:
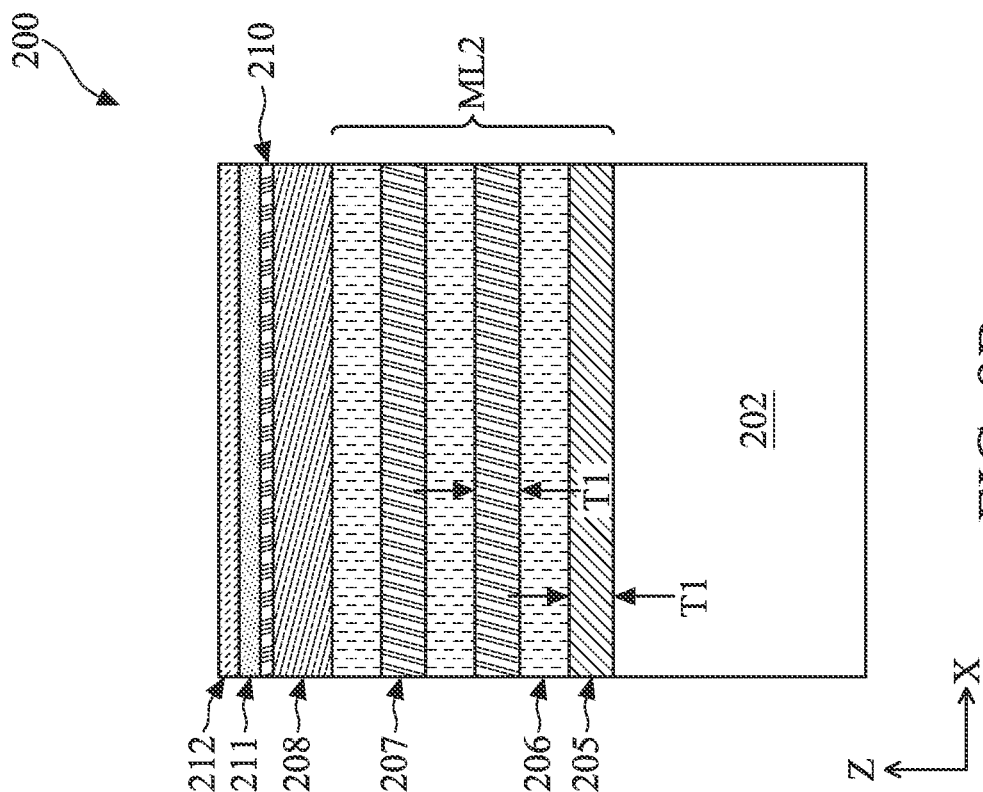
Figure 9A:
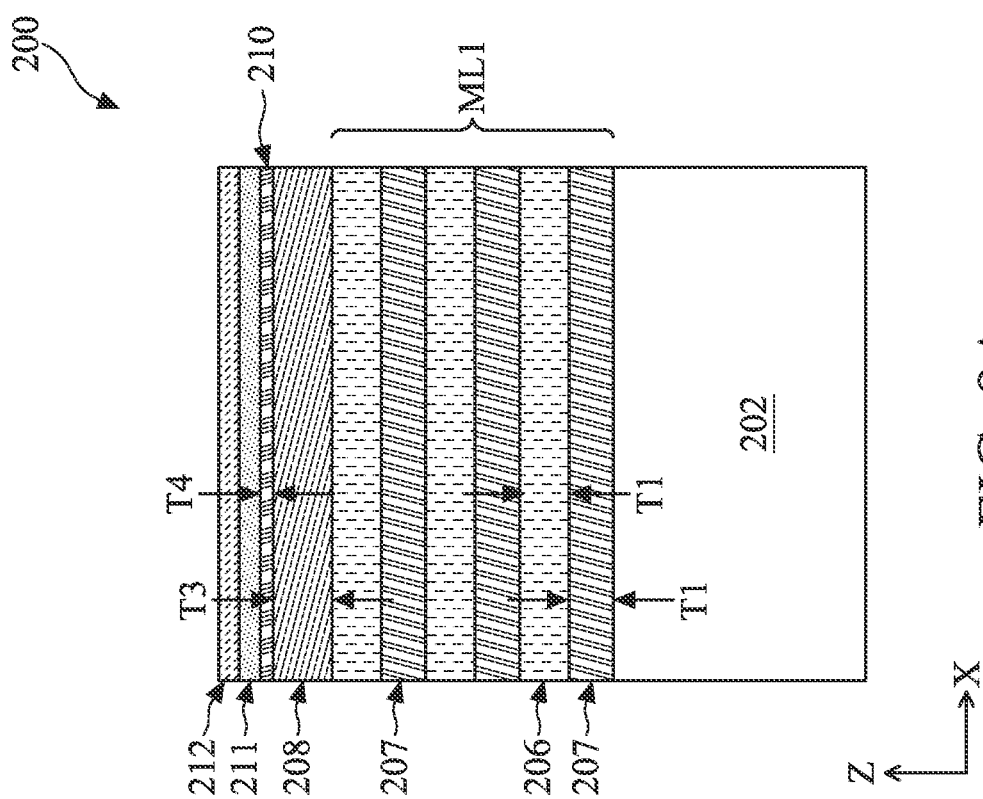
Figure 9C:
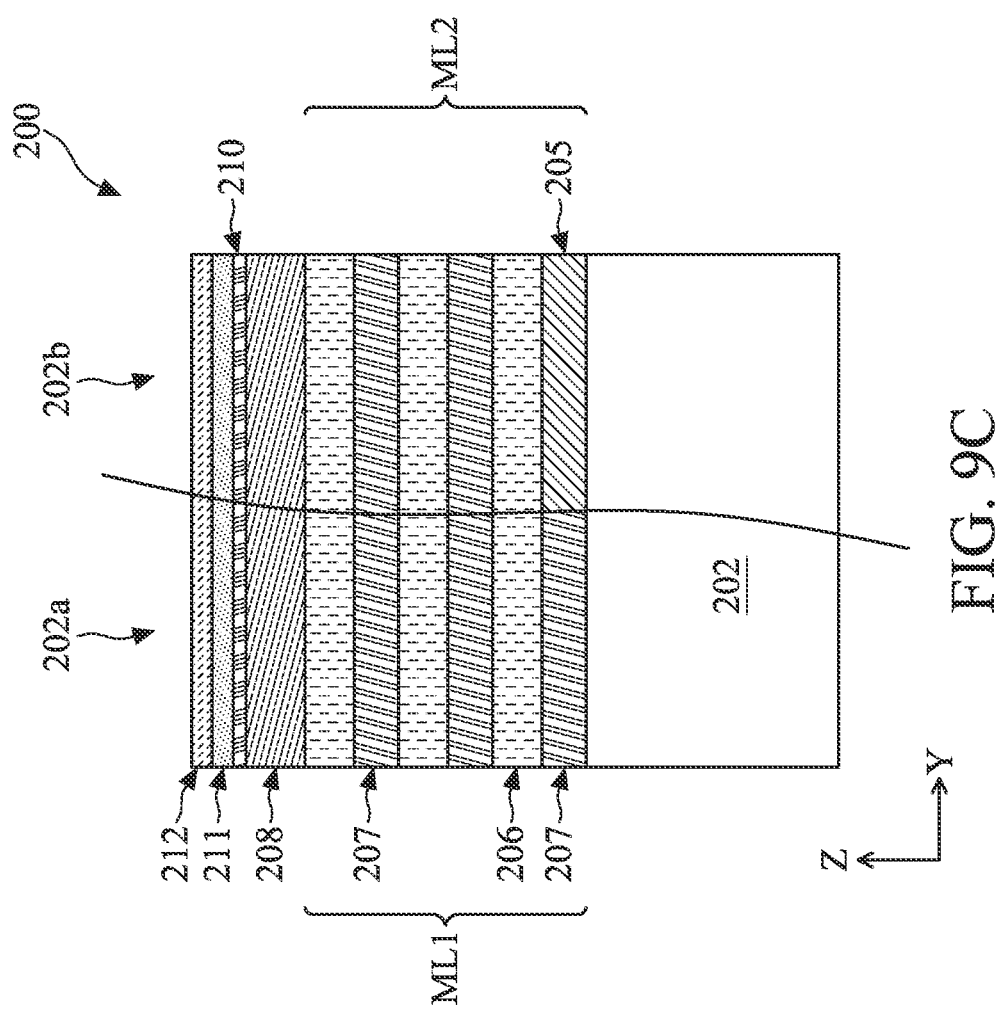
Figure 10A:
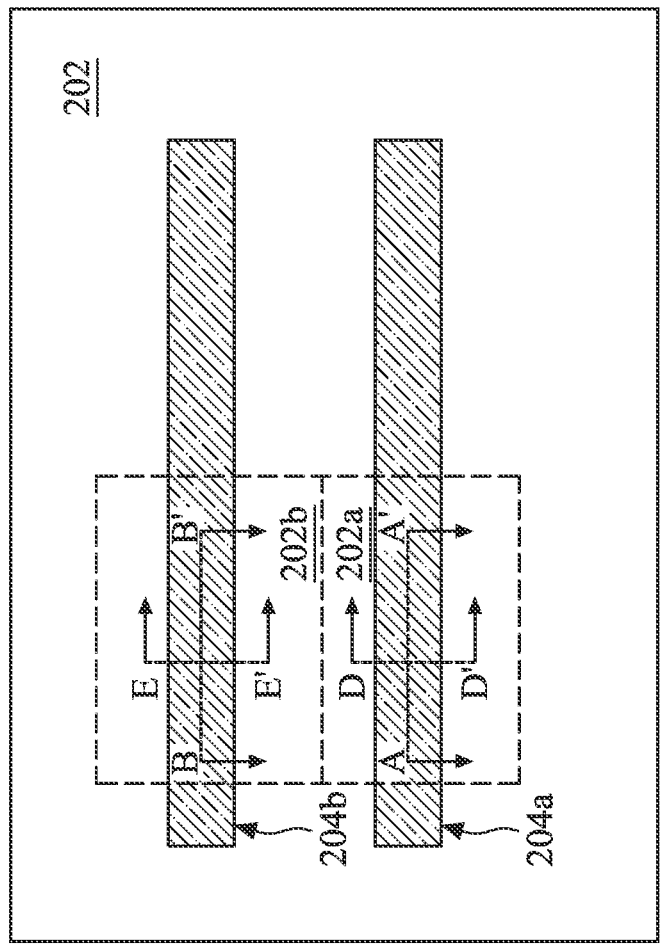
Figure 10B:
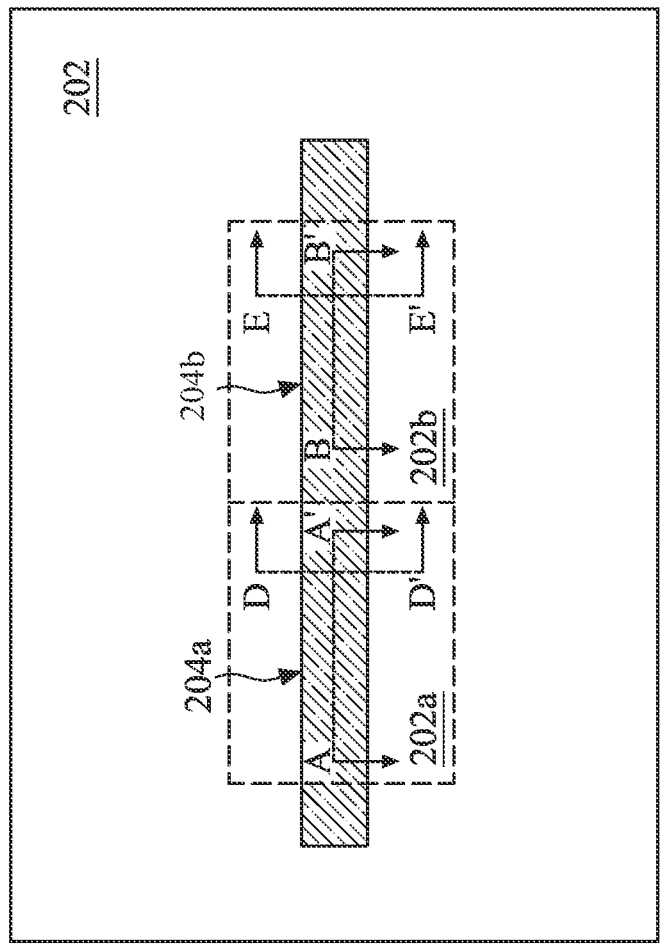
Figure 10C:
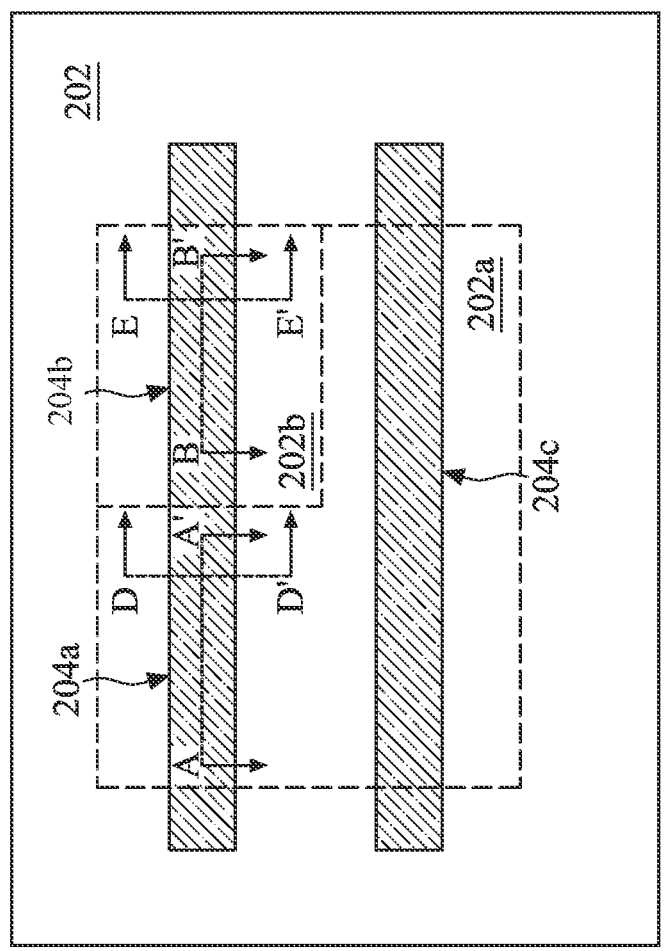
Figure 10E:
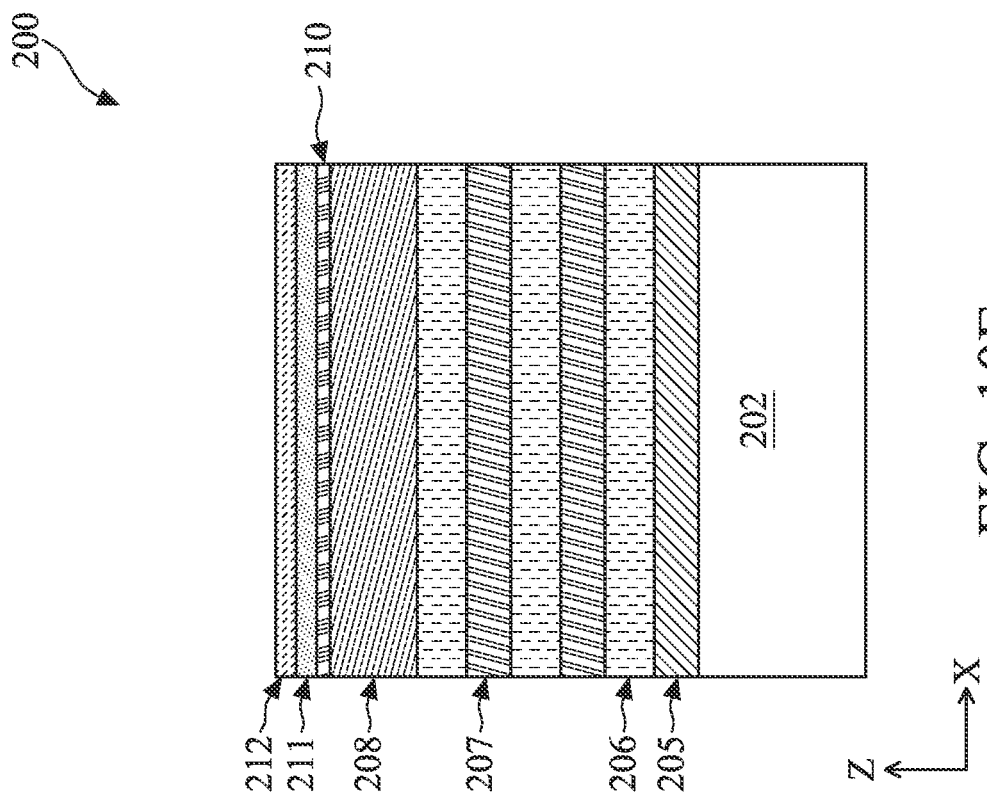
Figure 10D:
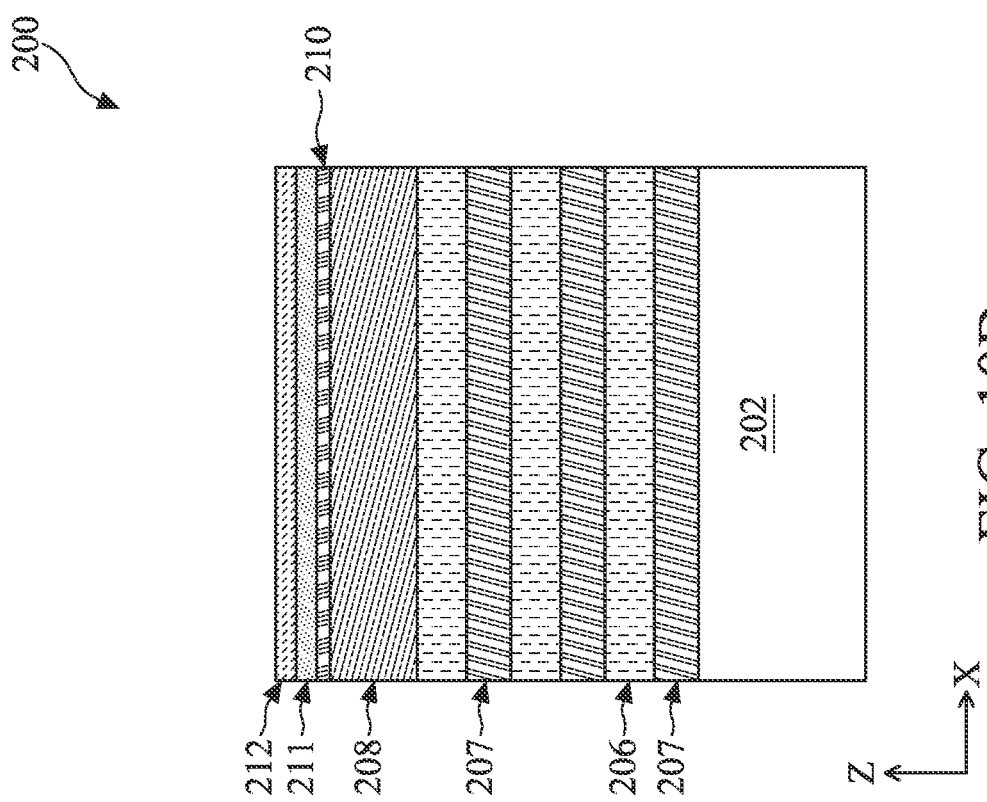
Figure 12B:
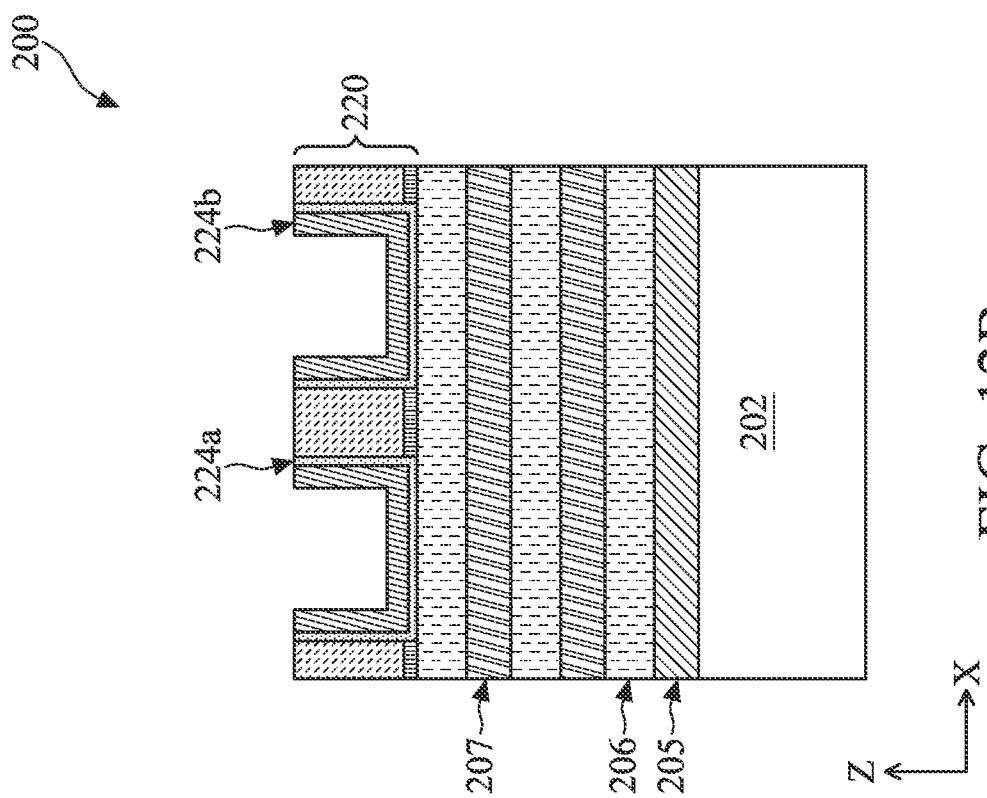
Figure 12A:
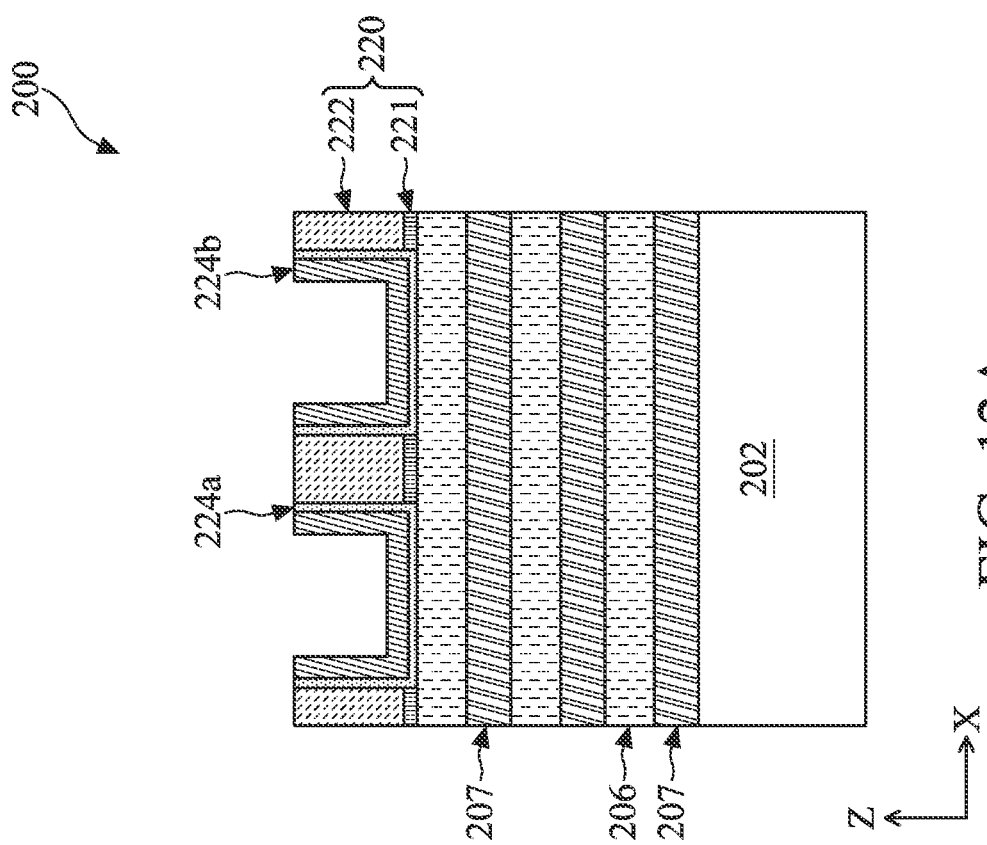
Figure 13A:
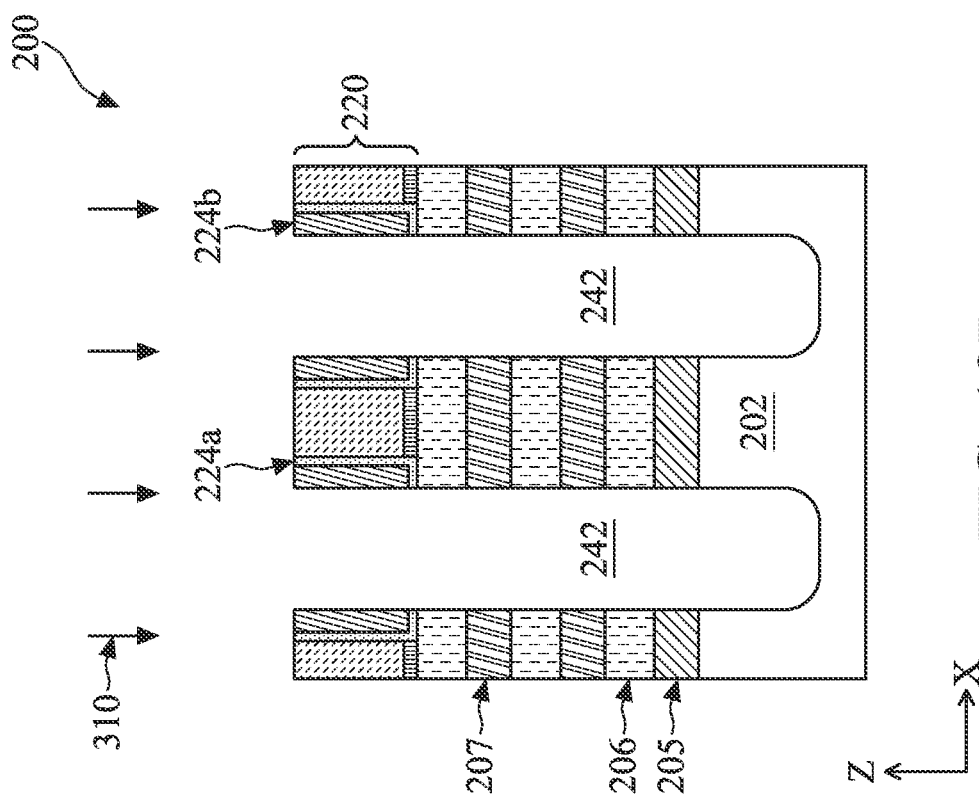
Figure 13B:
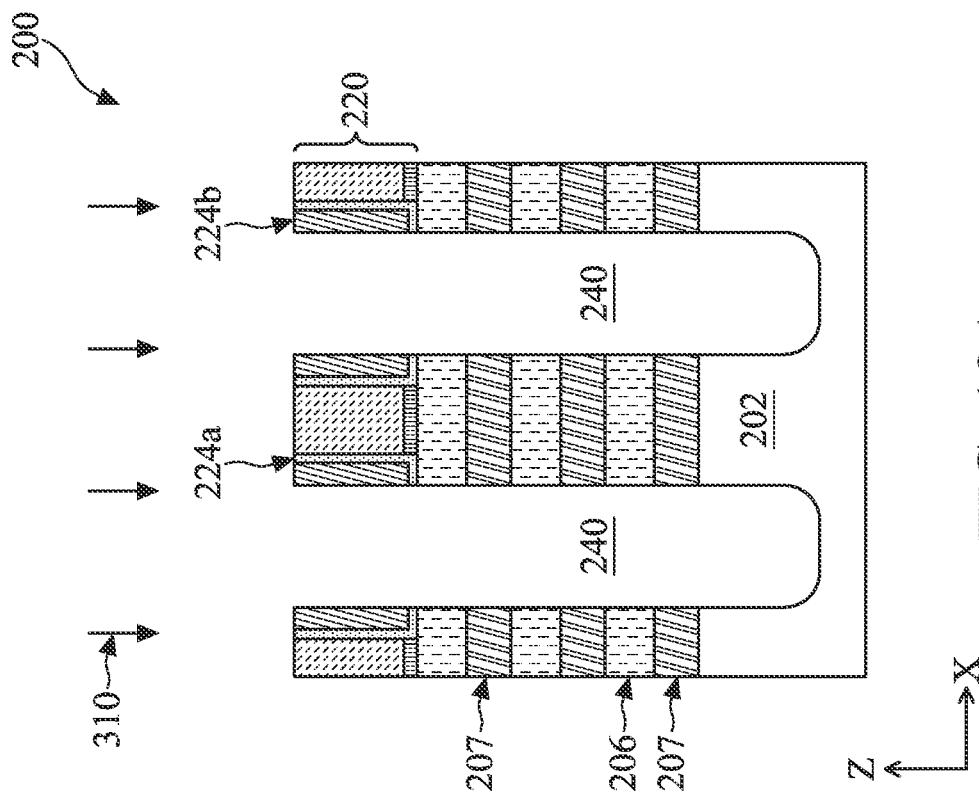
Figure 13C:
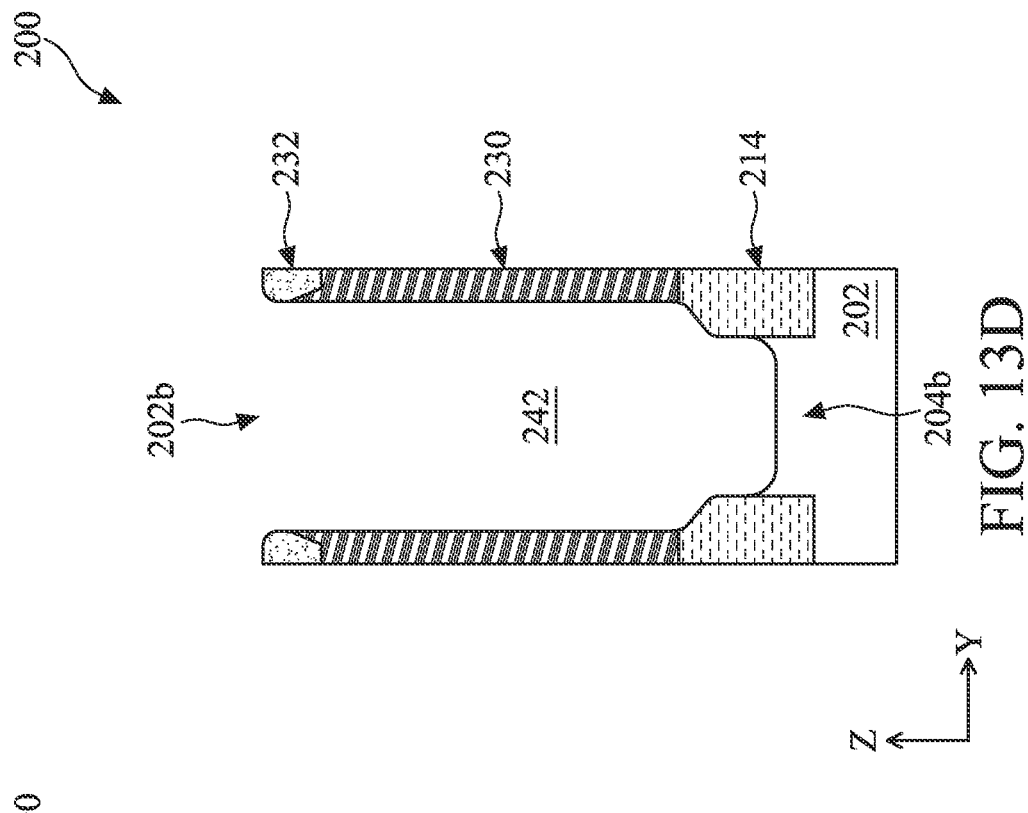
Figure 13D:
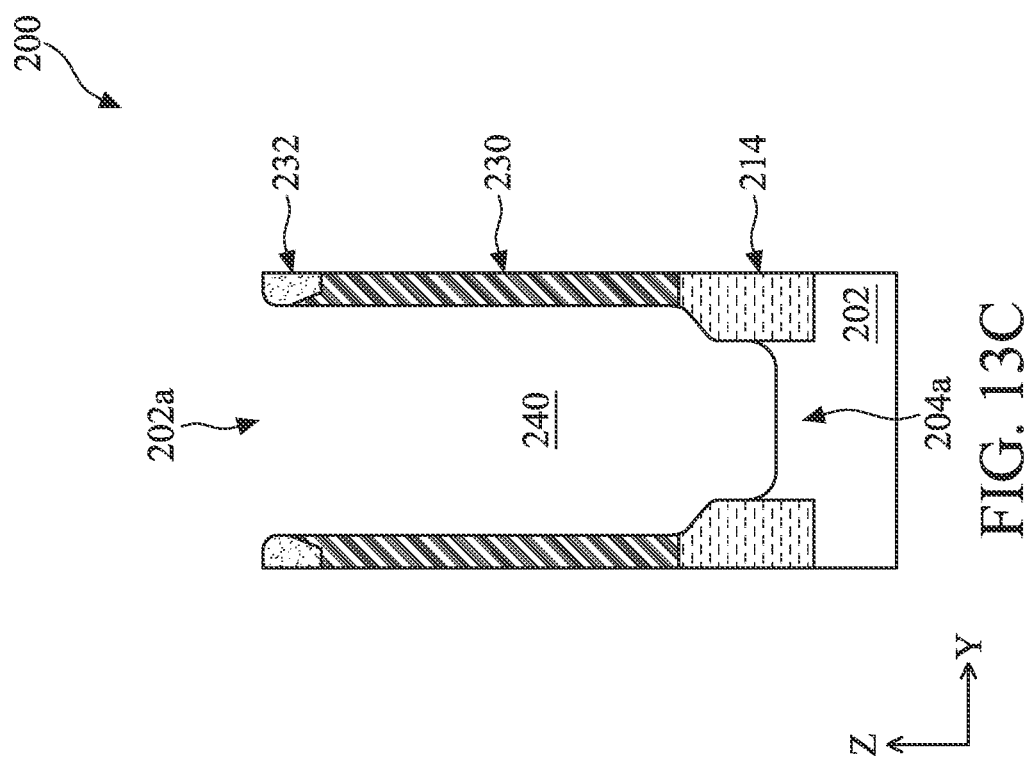
Figure 14C:
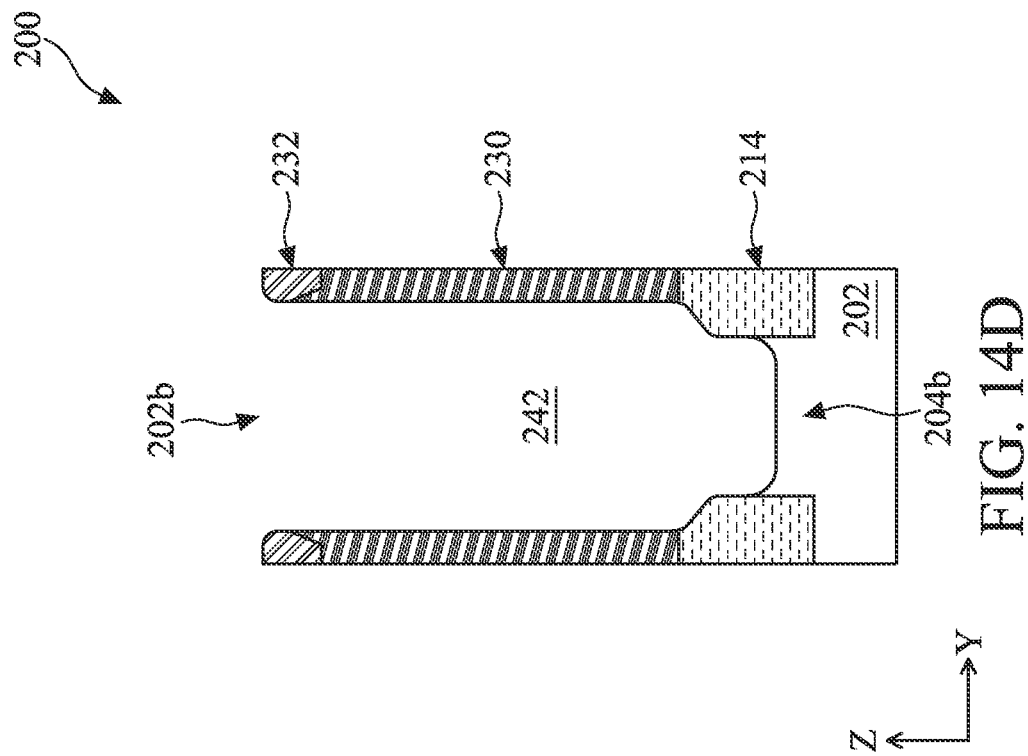
Figure 14D:
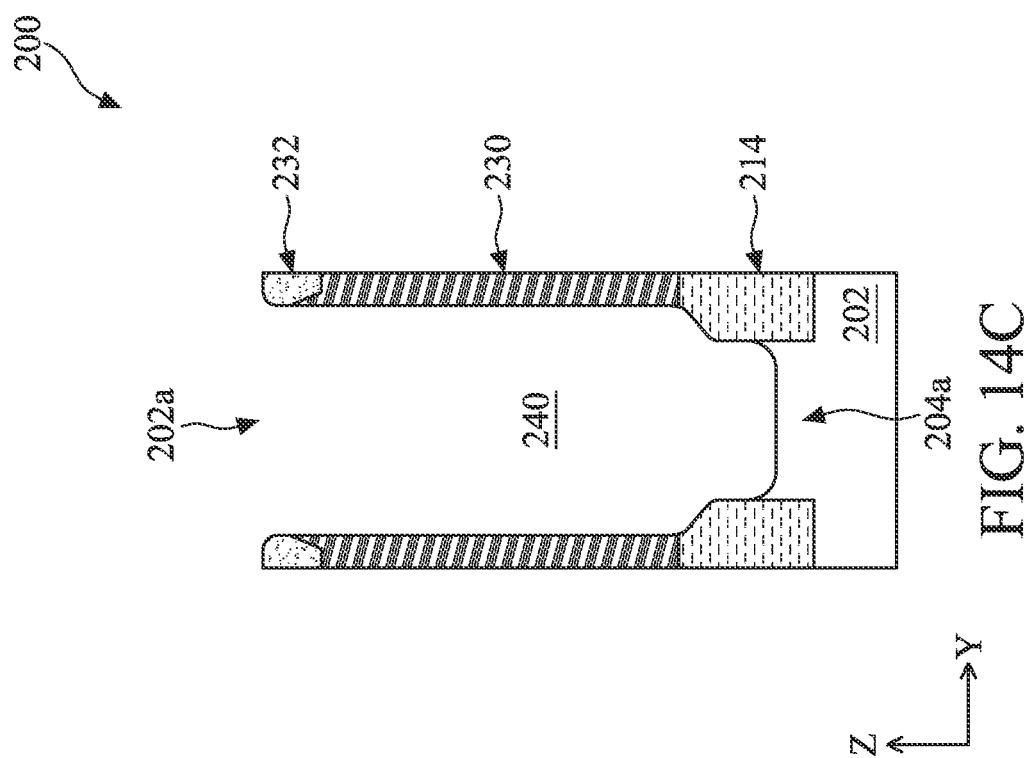
Figure 15B:
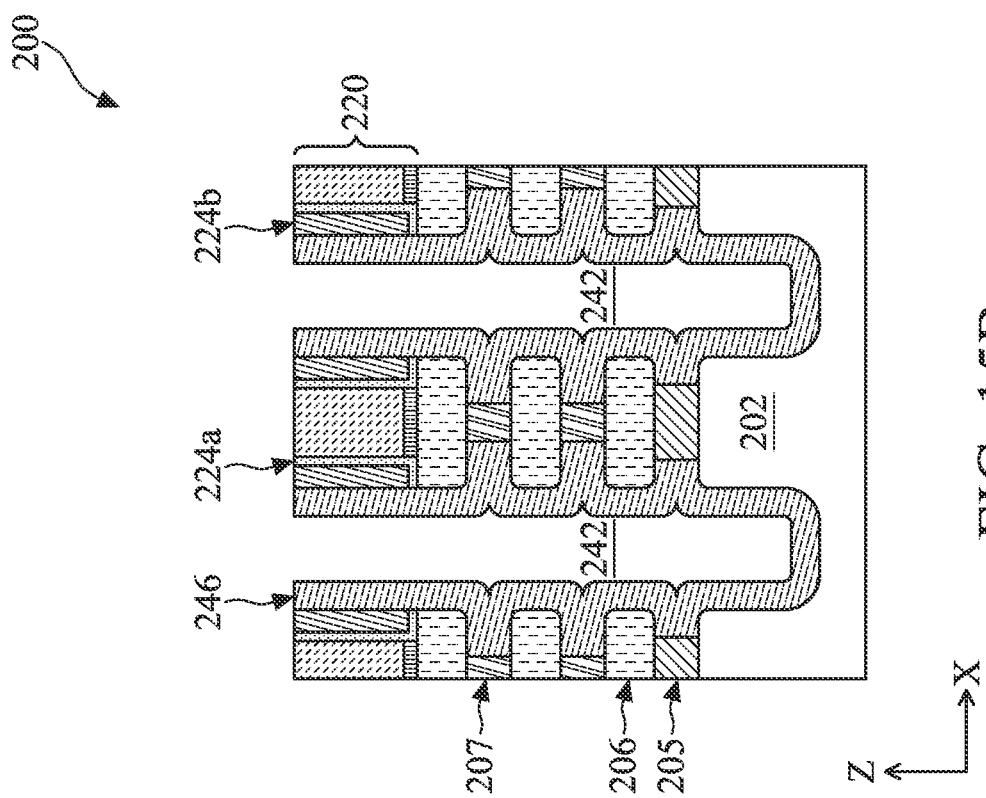
Figure 15A:
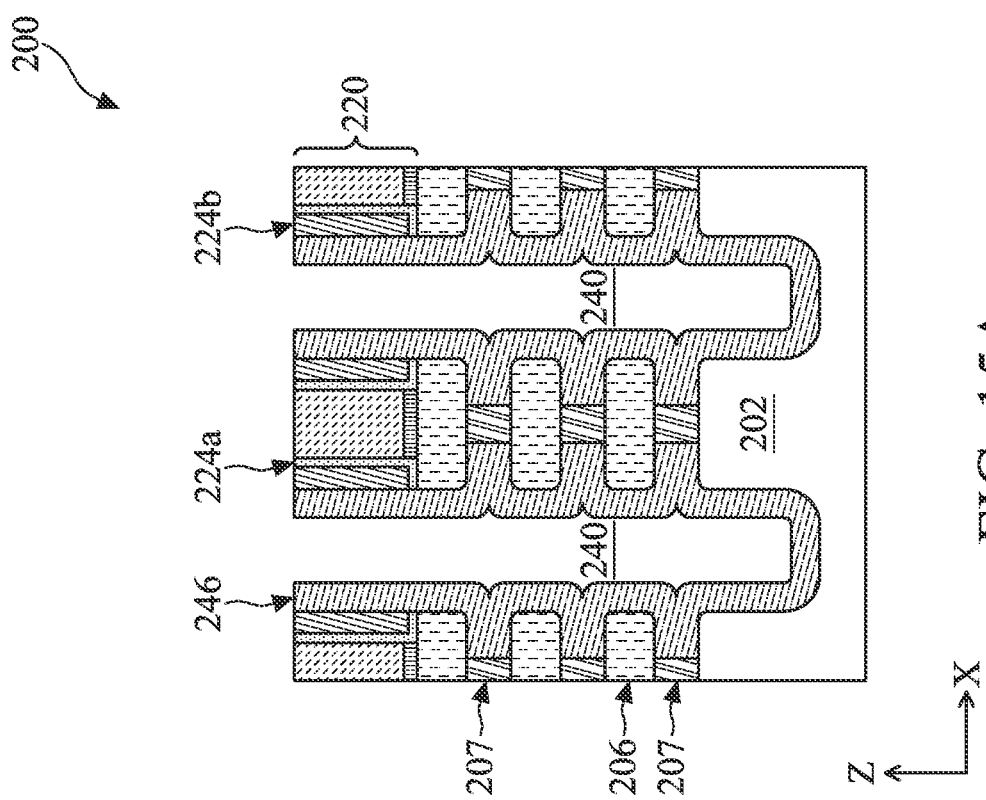
Figure 15C:
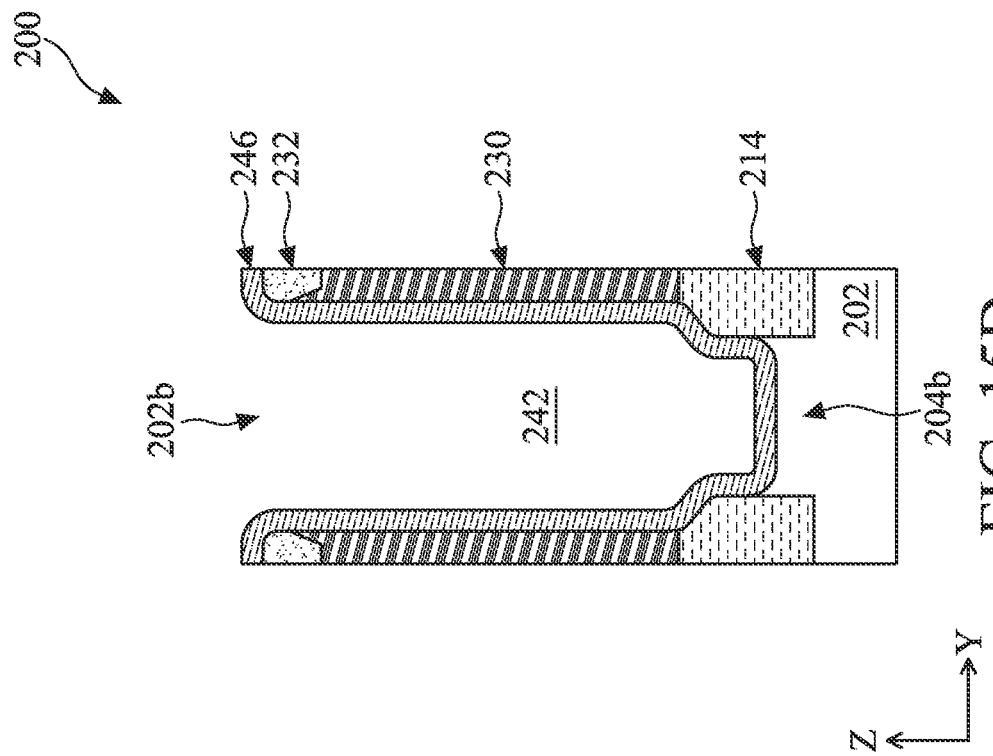
Figure 15D:
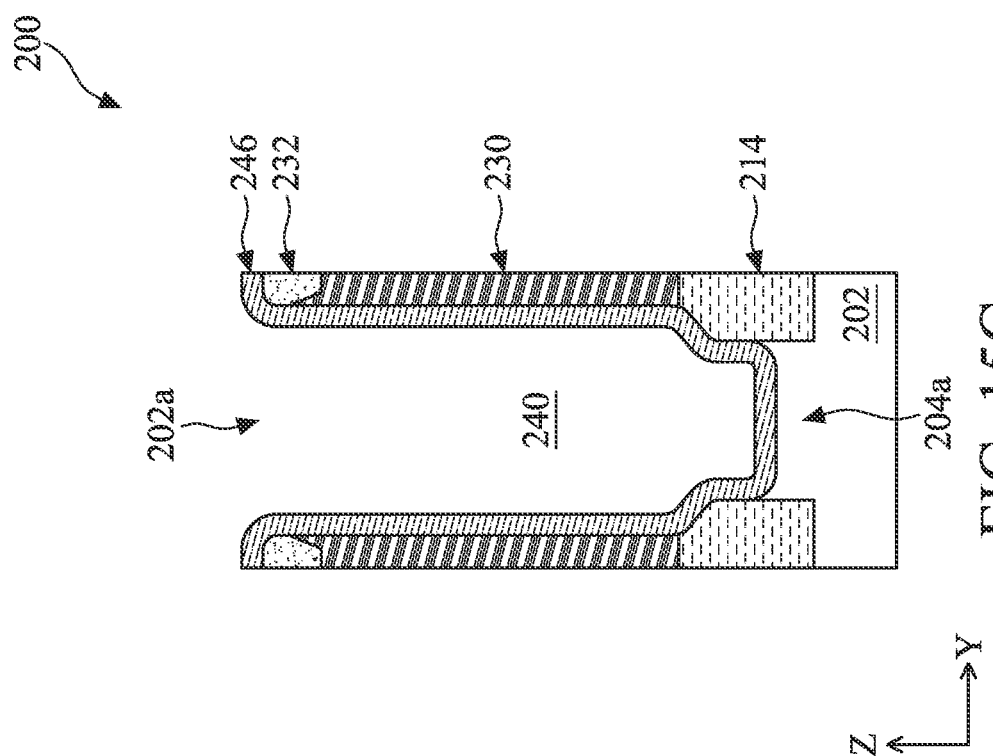
Figure 16C:
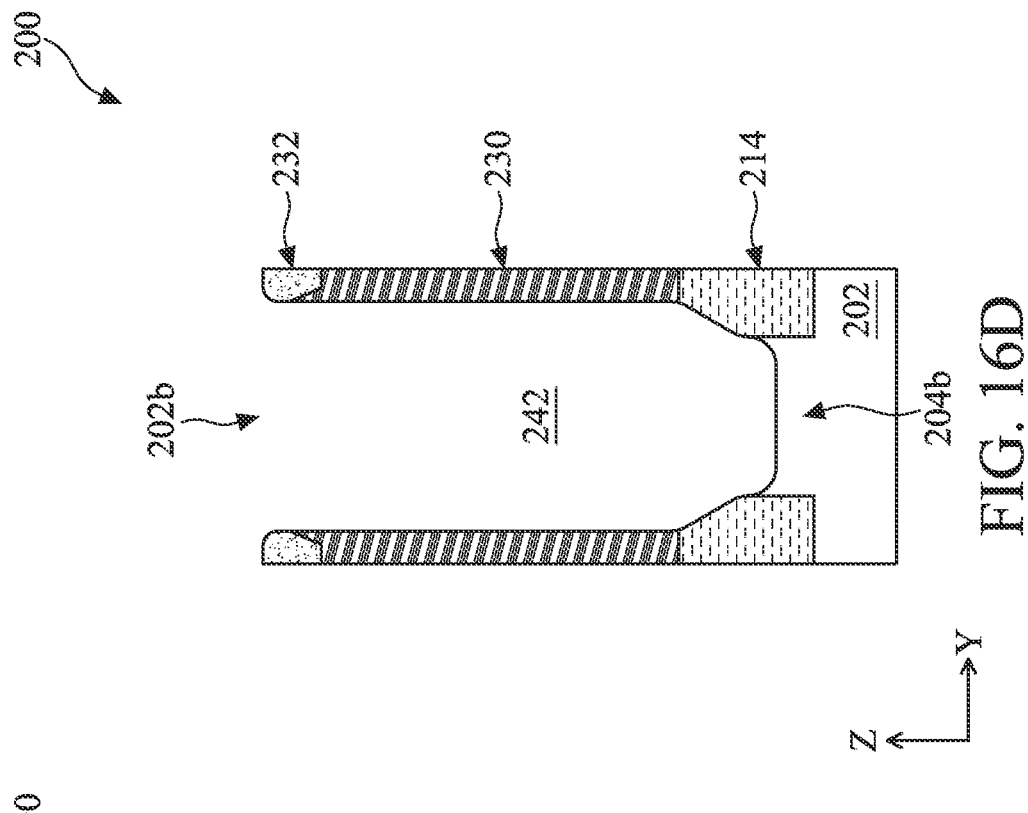
Figure 16D:
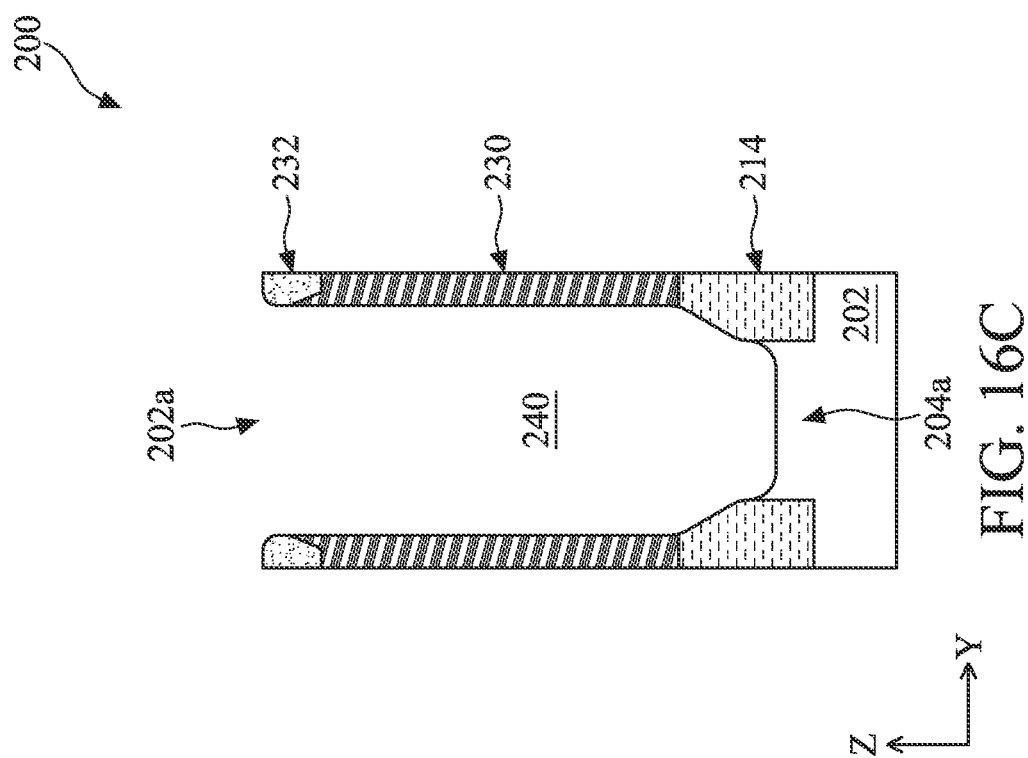
Figure 17B:
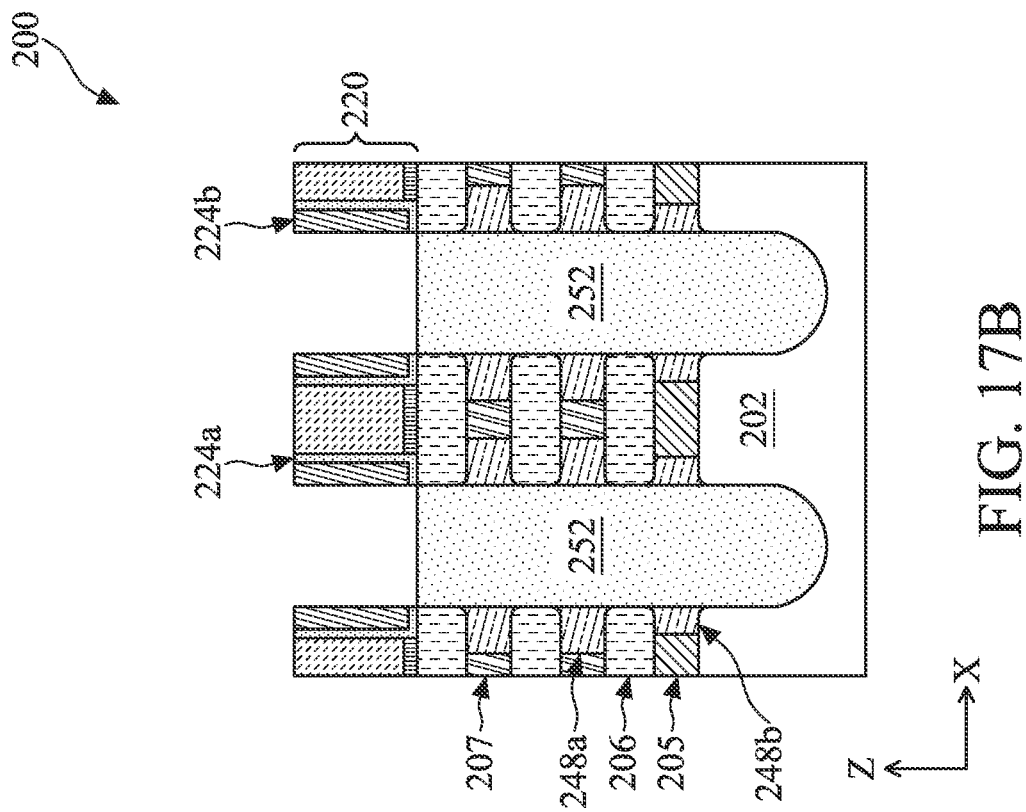
Figure 17A:
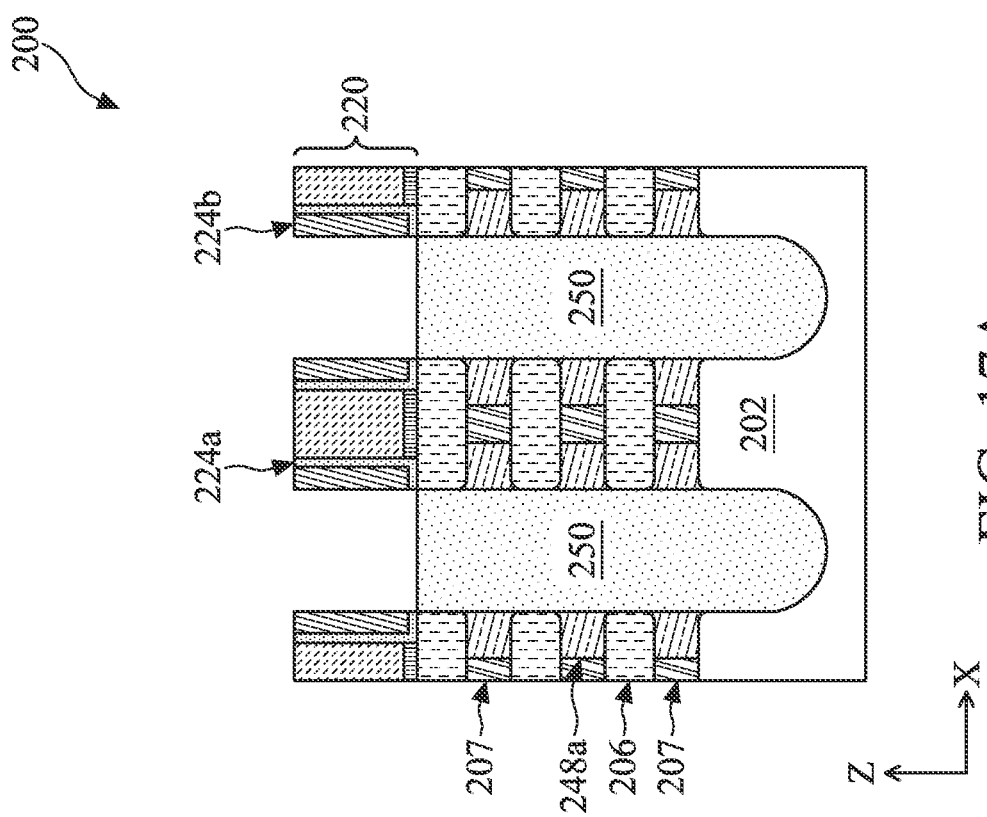
Figure 18B:
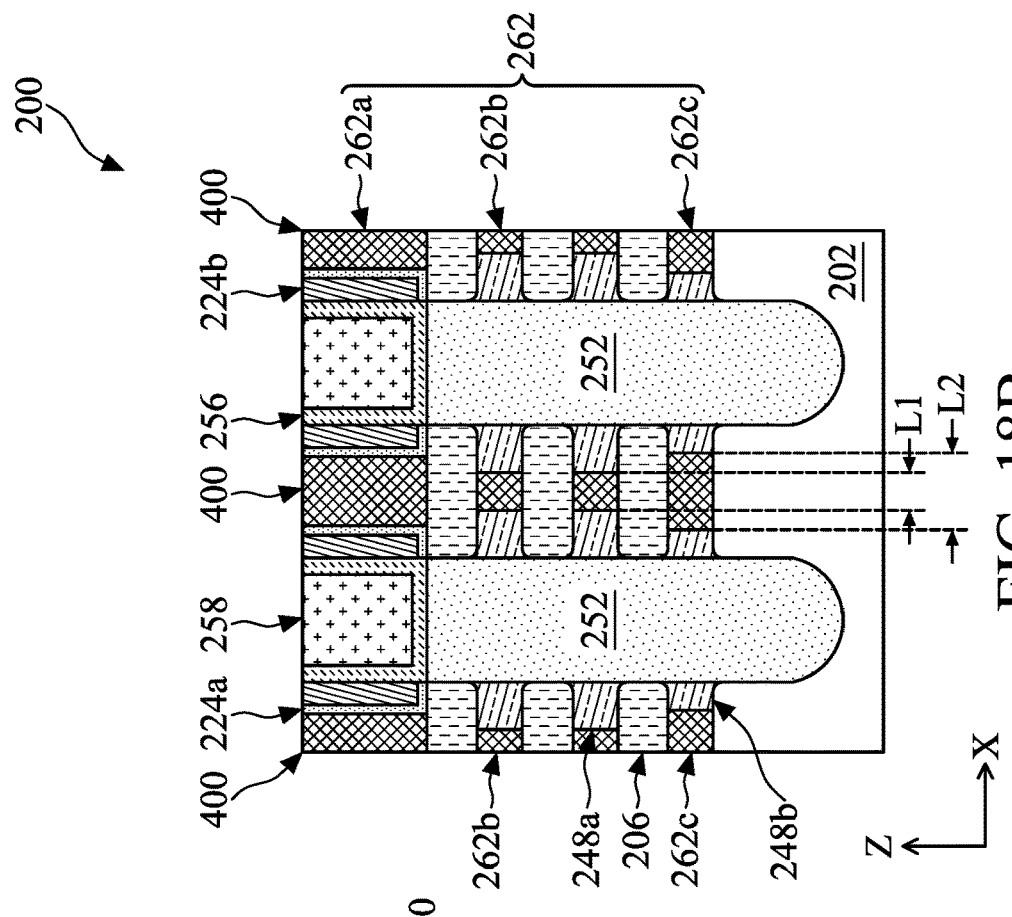
Figure 18A:
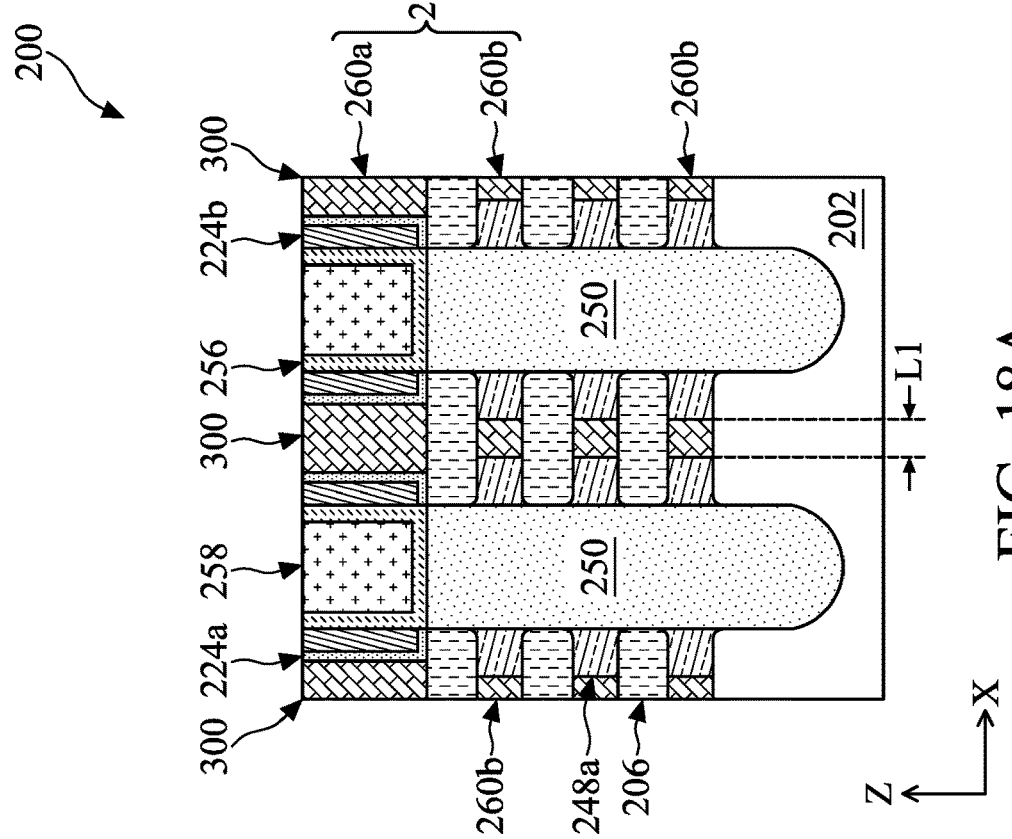

Referring now to FIGS. 1A, 1B, and 1C collectively, a flowchart of a method 100 of forming a semiconductor structure 200 (hereafter simply referred to as the structure 200) is illustrated according to various aspects of the present disclosure. Method 100 is merely an example and is not intended to limit the present disclosure beyond what is explicitly recited in the claims. Additional operations can be provided before, during, and after method 100 and some operations described can be replaced, eliminated, or moved around for additional embodiments of the method. Method 100 is described below in conjunction with FIGS. 2A-18D, which are various cross-sectional and top planar views of the structure 200 at intermediate steps of method 100. For examples, FIGS. 2A-2C and 10A-10C are planar top views of a portion of the structure 200; FIGS. 3A, 4A, 5A, 6A, 7A, 8A, and 9A are cross-sectional views of the structure 200 taken along line AA' as shown in FIG. 2A, 2B, or 2C; FIGS. 3B, 4B, 5B, 6B, 7B, 8B, and 9B are cross-sectional views of the structure 200 taken along line BB' as shown in FIG. 2A, 2B, or 2C; FIGS. 3C, 4C, 5C, 6C, 7C, 8C, and 9C are cross-sectional views of the structure 200 taken along line CC' as shown in FIG. 2A, 2B, or 2C; FIGS. 10D, 12A, 13A, 14A, 15A, 16A, 17A, and 18A are cross-sectional views of the structure 200 taken along line AA' as shown in FIG. 10A, 10B, or 10C; FIGS. 10E, 12B, 13B, 14B, 15B, 16B, 17B, and 18B are cross-sectional views of the structure 200 taken along line BB' as shown in FIG. 10A, 10B, or 10C; FIGS. 10F, 11A, 12C, 13C, 14C, 15C, 16C, 17C, and 18C are cross-sectional views of the structure 200 taken along line DD' in FIG. 10A, 10B, or 10C; and FIGS. 10G, 11B, 12D, 13D, 14D, 15D, 16D, 17D, and 18D are cross-sectional views of the structure 200 taken along line EE' in FIG. 10A, 10B, or 10C. In the present embodiments, lines DD' and EE' are each taken through an S/D region of a device included in the structure 200.

The structure 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

At operation 102, referring to FIGS. 1A, 2A-2C, and 3A-3C, method 100 provides a substrate 202 and forms a SiGe-containing layer (or SiGe layer) 205 over a region 202a and a region 202b of the substrate 202. In some embodiments, referring to FIGS. 2A-2C, the regions 202a and 202b are disposed immediately adjacent to each other. In some embodiments, the regions 202a and 202b are separated by other region(s) of the substrate 202. For embodiments in which layout areas of memory and/or logic cells are limited, separation between the regions 202a and 202b is minimized. In some examples, referring to FIG. 2A, the regions 202a and 202b may be arranged adjacent to each other along the Y axis; in some examples, referring to FIG. 2B, the regions 202a and 202b may be arranged adjacent to each other along the X axis; and in further examples, referring to FIG. 2C, the region 202a may be disposed adjacent to the region 202b along both the X axis and the Y axis. The present disclosure does not limit the arrangement of the regions 202a and 202b to any particular example(s) depicted herein.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In the depicted embodiments, the SiGe layer 205 is a bottommost layer of a multi-layer structure (ML) in the region 202b. In the present embodiments, forming the SiGe layer 205 includes performing an epitaxy process. The epitaxy process may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge), which interacts with the composition of the underlying substrate, e.g., the substrate 202. In the present embodiments, the SiGe layer 205 includes about 20% to about 22% of Ge. In some examples, the SiGe layer 205 (and the additional layers of the ML) may be formed into nanosheets, nanowires, or nanorods.

At operation 104, referring to FIGS. 1A, 1C, and 4A-8C, method 100 replaces a portion of the SiGe layer 205 in the region 202a with a different SiGe layer 207, while a portion of the SiGe layer 205 remains in the region 202b. In other words, method 100 removes the portion of the SiGe layer 205 from the region 202a and subsequently forms the SiGe layer 207 having a different composition from that of the SiGe layer 205. In the present embodiments, referring to FIG. 1C, operation 104 may be implemented via Pathway A, which includes sub-operation 150, or Pathway B, which includes sub-operations 160-164.

In some embodiments, referring to Pathway A of FIG. 1C and to FIGS. 4A-4C, method 100 at sub-operation 150 selectively performs an implantation process (e.g., an ion implantation process) 302 to the region 202a with respect to the region 202b. Method 100 first forms a patterned masking element 209a over the region 202b to expose the region 202a. The patterned masking element 209a may be formed by a series of photolithography and etching processes. The patterned masking element 209a may be a tri-layer structure that includes a photoresist layer, a middle layer (containing a metal, a polymer, and/or other suitable materials), a bottom anti-reflective coating (BARC) layer. Forming the patterned masking element 209a may include exposing the photoresist layer, developing the photoresist layer, and etching the remainder of the masking element using the patterned photoresist layer as an etch mask.

Subsequently, method 100 performs the implantation process 302 to the region 202a exposed by the patterned masking element 209a. The implantation process 302 is configured to introduce Ge to the exposed portion of the SiGe layer 205, thereby forming the SiGe layer 207 that includes a greater amount of Ge than the SiGe layer 205. In other words, the implantation process 302 dopes Ge into the portion of the SiGe layer 205 in the region 202a, while the portion of the SiGe layer 205 under the patterned masking element 209a in the region 202b remains un-doped. In the present embodiments, the resulting concentration of Ge in the SiGe layer 207 is about 23% to about 25%. After performing the implantation process 302, referring to FIGS. 8A-8C, the patterned masking element 209a is removed from the structure 200 by a suitable method, such as plasma ashing and/or resist stripping.

In some embodiments, the implantation process 302 is implemented with a beam energy of about 20 keV to about 160 keV, and an ion dosage of about $1 \times 10^{15}$ ion/cm$^2$ to about $5 \times 10^{16}$ ions/cm$^2$. The present embodiments are not limited to these implantation conditions.

In some embodiments, referring to Pathway B of FIG. 1C and to FIGS. 5A-5C, method 100 at sub-operation 160 selectively removes the portion of the SiGe layer 205 from the region 202a to expose the underlying substrate 202 in an etching process 304. Method 100 first forms a patterned masking element 209b over the region 202b to expose the region 202a. The patterned masking element 209b may be substantially similar to the patterned masking element 209a. Subsequently, method 100 performs the etching process 304 to remove the exposed portion of the SiGe layer 205. The etching process 304 may be a dry etching process, a wet etching process, a reactive ion etching (RIE) process, other suitable processes, or combinations thereof. In the present embodiments, the etching process 304 selectively removes the SiGe layer 205 without removing, or substantially removing, the underlying substrate 202 in the region 202a.

After removing the portion of the SiGe layer 205, the patterned masking element 209b is removed from the structure 200 by plasma ashing and/or resist stripping.

Referring to FIGS. 6A-6C, method 100 at sub-operation 162 deposits the SiGe layer 207 over the etched SiGe layer 205 in a deposition process 306, such that the SiGe layer 207 directly contacts the SiGe layer 205 and the substrate 202 in the regions 202b and 202a, respectively. The deposition process 306 may be an epitaxial growth process similar to that discussed above with respect to forming the SiGe layer 205, resulting in an epitaxial crystalline SiGe layer 207. Alternatively, the deposition process 306 may be a conformal deposition process implemented by a method such as CVD, atomic layer deposition (ALD), and/or other suitable methods to form an amorphous SiGe layer 207. In the present embodiments, the deposition process 306 is controlled such that the SiGe layer 207 is formed to a thickness T2 that is substantially similar to or the same as a thickness T1 of the SiGe layer 205, ensuring the uniformity of the subsequently-formed layers of the ML.

Subsequently, referring to FIGS. 7A-7C, method 100 at sub-operation 164 selectively removes a portion of the SiGe layer 207 in the region 202b in an etching process 308, leaving behind a portion of the SiGe layer 207 in the region 202a. Method 100 first forms a patterned masking element 209c over the region 202a to expose the region 202b. The patterned masking element 209c may be substantially similar to the patterned masking element 209a. Subsequently, method 100 performs the etching process 308 to remove the exposed portion of the SiGe layer 207. The etching process 308 may be a dry etching process, a wet etching process, an RIE process, other suitable processes, or combinations thereof. In the present embodiments, the etching process 308 selectively removes the SiGe layer 207 without removing, or substantially removing, the underlying SiGe layer 205 in the region 202b. After removing the portion of the SiGe layer 207, referring to FIGS. 8A-8C, the patterned masking element 209c is removed from the structure 200 by plasma ashing and/or resist stripping.

At operation 106, referring to FIGS. 1A and 9A-9C, method 100 completes the formation of an ML1 over the SiGe layers 207 in the region 202a and an ML2 over the SiGe layer 205 in the region 202b. Each ML further includes a stack of alternating Si-containing layers (or Si layers) 206 and SiGe layers 207 formed over the regions 202a and 202b. In the present embodiments, the Si layers 206 are free, or substantially free, of any Ge. The SiGe layers 205 and 207 in each ML are sacrificial layers configured to be removed subsequently, thereby providing openings between the Si layers 206 for forming a metal gate stack. Accordingly, the SiGe layers 205 and 207 may be collectively referred to as the non-channel layers and the Si layers 206 are referred to as the channel layers of each ML. In the present embodiments, forming the remainder of each ML includes alternatingly growing the Si layers 206 and the SiGe layers 207 in a series of epitaxy processes as discussed in detail above with respect to forming the SiGe layer 205.

In the present embodiments, method 100 at operation 106 further forms a hard mask layer 208 over each ML, a Si layer 210 over the hard mask layer 208, and hard mask layers 211 and 212 over the Si layer 210. The hard mask layer 208 is a sacrificial layer configured to facilitate the formation of isolation features between the subsequently-formed active regions (e.g., fins). In some embodiments, the hard mask layer 208 may be formed to a thickness T3 that is greater than the thickness T1 or T2 as defined above. The hard mask layer 208 may include any suitable material, such as a semiconductor material, so long as its composition is distinct from that of the isolation features and the Si layer 206 disposed thereunder to allow selective removal by an etching process. In some embodiments, the hard mask layer 208 has a composition similar to or the same as that of the SiGe layers 207. For embodiments in which the hard mask layer 208 has the same composition as the SiGe layers 207, the hard mask layer 208 may also be grown by an epitaxy process as discussed above.

The Si layer 210 acts as a buffer to facilitate the growth of the hard mask layer 211, which may include an oxide material. In some embodiments the Si layer 210 is formed to a thickness T4 that is less than the thickness T1 or T2 as defined above. In some examples, the thickness T4 may be about 1 nm. The hard mask layers 211 and 212 are configured to protect the underlying hard mask layer 208 and the ML during subsequent fabrication processes and may each include any suitable dielectric material, such as silicon oxide (SiO and/or $SiO_2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), other suitable materials, or combinations thereof. In the present embodiments, the hard mask layers 211 and 212 include different dielectric materials. In one such example, the hard mask layer 211 may include silicon oxide and the hard mask layer 212 may include silicon nitride. The hard mask layers 211 and 212 may be formed by any suitable method, such as CVD, ALD, PVD, other suitable methods, or combinations thereof.

At operation 108, referring to FIGS. 1A and 10A-10G, method 100 forms an active region protruding from the region 202a (i.e., in the ML1) and an active region protruding from the region 202b (i.e., in the ML2). In some embodiments, referring to FIG. 10A, which corresponds to the example embodiment shown in FIG. 2A, method 100 forms active regions 204a and 204b as fins each arranged lengthwise along the X axis and separated from each other along the Y axis. In some embodiments, referring to FIG. 10B, which corresponds to the example embodiment shown in FIG. 2B, the active regions 204a and 204b are portions of the same fin disposed adjacent to each other along the X axis (i.e., the lengthwise direction of the fin). In some embodiments, referring to FIG. 10C, which corresponds to the example embodiment shown in FIG. 2C, method 100 forms an additional active region 204c (i.e., in the ML1) in the region 202a, where the active regions 204a and 204b are arranged adjacent to each other along the X axis as portions of a first fin and the active region 204c is a portion of a second fin separated from the first fin along the Y axis. In the present embodiments, the active regions 204a-204c are each configured to provide an NS FET. In one such example, each NS FET provided by the active regions 204a-204c may be a portion of an SRAM cell. While embodiments depicted in FIGS. 10A, 10B, and 10C are equally applicable in the present disclosure, subsequent operations of method 100 are discussed in the context of the active regions 204a and 204b for purposes of simplicity.

Method 100 forms the active regions 204a and 204b using a series of photolithography and etching processes similar to those discussed above with respect to forming the patterned masking element 209a. For example, the photolithography process may include forming a masking element over each ML, exposing the masking element, and developing the exposed masking element to form a patterned masking element (not depicted). The hard mask layer 212 is then etched using the patterned masking element as an etch mask, followed by the etching of the hard mask layer 211, the Si layer 210, the hard mask layer 208, and the ML1 and ML2 to form the active regions 204a and 204b, respectively. The etching process may include dry etching, wet etching, RIE, other suitable processes, or combinations thereof. The patterned masking element is subsequently removed using any suitable process, such as ashing and/or resist stripping.

Numerous other embodiments of methods to form the active regions 204a and 204b may be suitable. For example, the active regions 204a and 204b may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used to pattern the active regions 204a and 204b.

Still referring to FIGS. 10F and 10G, method 100 at operation 108 subsequently forms isolation structures 214 in a trench adjacent to the active regions 204a and 204b. The isolation structures 214 may include SiO and/or $SiO_2$, tetraethylorthosilicate (TEOS), doped silicon oxide (borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structures 214 may include shallow trench isolation (STI) features. In one embodiment, the isolation structures 214 are formed by filling the trench adjacent to the active regions 204a and 204b with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and etched back to form the isolation structures 214. The isolation structures 214 may include a single-layer structure or a multi-layer structure. In some embodiments, the CMP process also removes the hard mask layers 211 and 212 and the Si layer 210 from the structure 200. In some embodiments, the hard mask layers 211 and 212 and the Si layer 210 are removed separately by one or more etching processes after forming the isolation structures 214.

At operation 110, referring to FIGS. 1A and 11A-11B, method 100 forms a cladding layer 213 over the active regions 204a and 204b and the isolation structures 214. In the present embodiments, the cladding layer 213 and the SiGe layers 205 and 207 are sacrificial layers configured to be replaced with a metal gate stack in a channel region of each active region 204a and 204b. In the present embodiments, the cladding layer 213 includes SiGe. In some embodiments, the cladding layer 213 is deposited epitaxially by a suitable method discussed above with respect to forming the SiGe layer 205. In some embodiments, the cladding layer 213 is deposited conformally, rather than grown epitaxially, over surfaces of the structure 200 as an amorphous layer, such that the cladding layer 213 is also formed over the isolation structures 214. Subsequently, method 100 performs a directional (or anisotropic) etching process to selectively remove portions of the cladding layer 213, thereby exposing portions of the isolation structures 214 and a top surface of the Si layer 210. The etching process may include a dry etching process, a wet etching process, an RIE process, or combinations thereof. The etching process may implement an etchant that selectively removes horizontal portions of the cladding layer 213 without removing, or substantially removing the isolation structures 214 or vertical portions of the cladding layer 213.

At operation 112, referring to FIGS. 1A and 12A-12D, method 100 forms a dielectric helmet 232 adjacent to each active region 204a and 204b. In the present embodiments, referring to FIGS. 12C and 12D, forming the dielectric helmet 232 includes first forming a dielectric layer 230 over the structure 200, thereby completely filling the trench adjacent to the active regions 204a and 204b. The dielectric layer 230 is configured to isolate the active regions 204a and 204b and to provide a substrate over which gate isolation features may be subsequently formed. The dielectric layer 230 may include a single-layered structure or a multi-layered structure. The dielectric layer 230 may include any suitable dielectric material, such as SiO and/or $SiO_2$, SiN, SiC, SiON, SiOC, SiCN, TEOS, doped silicon oxide (e.g., BPSG, FSG, PSG, BSG, etc.), other suitable materials, or combinations thereof. The dielectric layer 230 may be deposited by any suitable method, such as CVD, FCVD, SOG, other suitable methods, or combinations thereof, and subsequently planarized by one or more CMP process to expose a top surface of the hard mask layer 208. As depicted herein, the dielectric layer 230 is separated from each sidewall of the active regions 204a and 204b by the cladding layer 213.

Subsequently, still referring to FIGS. 12A-12D, method 100 forms the dielectric helmet 232 over the dielectric layer 230. In some embodiments, the dielectric helmet 232 provides one or more gate isolation features configured to separate (or cut) a subsequently-formed metal gate stack over the active regions 204a and 204b. In the present embodiments, for purposes of enhancing etching selectivity, the dielectric helmet 232 is configured with a composition different from that of the dielectric layer 230, and may include silicon oxide, SiN, SiC, SiON, SiOC, SiCN, $Al_2O_3$, a high-k dielectric material (e.g., hafnium oxide ($HfO_2$), lanthanum oxide ($La_2O_3$), etc.), other suitable materials, or combinations thereof. In some embodiments, the dielectric helmet 232 includes a dielectric material having a higher dielectric constant than the dielectric layer 230. For example, the dielectric helmet 232 may include a high-k dielectric material, such as $HfO_2$, and the dielectric layer 230 may include silicon oxide. In some embodiments, method 100 forms the dielectric helmet 232 by first recessing the dielectric layer 230 to form trenches (not depicted), depositing a dielectric material in the trenches by a suitable method, such as CVD and/or ALD, and planarizing the dielectric material by a CMP process to form the dielectric helmet 232.

At operation 114, still referring to FIGS. 12A-12D, method 100 forms dummy gate stacks 220 over channel regions of the active regions 204a and 204b. In the present embodiments, referring to FIGS. 12C and 12D, method 100 first removes the hard mask layer 208 to form trenches 219, thereby exposing the topmost Si layer 206 of each ML. In the present embodiments, method 100 selectively removes the hard mask layer 208 without removing, or substantially removing, the dielectric helmet 232 or the topmost Si layer 206 of each ML. Subsequently, referring to FIGS. 12A and 12B, method 100 forms the dummy gate stacks 220 over channel regions of the active regions 204a and 204b, thereby filling the trenches 219. Each dummy gate stack 220 may include a dummy gate electrode 222 disposed over an optional dummy gate dielectric layer (not depicted) and an interfacial layer 221. In some embodiments, at least portions of each dummy gate stack 220 are to be replaced with a metal gate stack, which may be separated (or cut) by the dielectric helmet 232.

The dummy gate stacks 220 may be formed by a series of deposition and patterning processes. For example, the dummy gate stacks 220 may be formed by depositing a polysilicon (poly-Si) layer over the active regions 204a and 204b separated by the dielectric helmet 232, and subsequently patterning the poly-Si layer via a series of photolithography and etching processes (e.g., an anisotropic dry etching process). The interfacial layer 221 may include silicon oxide and may be formed by any suitable method, such as thermal oxidation, chemical oxidation, other suitable methods, or combinations thereof.

Still referring to FIGS. 12A-12D, method 100 at operation 114 subsequently forms top gate spacers 224 on sidewalls of the dummy gate stacks 220. The top gate spacers 224 may be a single-layer structure or a multi-layer structure and may include silicon oxide, SiN, SiC, SiON, SiOC, SiCN, air, a low-k dielectric material, a high-k dielectric material (e.g., $HfO_2$, $La_2O_3$, etc.), other suitable materials, or combinations thereof. In the present embodiments, the top gate spacers 224 includes a spacer layer 224b disposed over a spacer layer 224a. Each spacer layer of the top gate spacers 224 may be formed by depositing the spacer layers 224a and 224b over the dummy gate stacks 220 via a suitable deposition method, such as CVD and/or ALD. In some embodiments, method 100 performs an anisotropic (or directional) etching process to remove portions of the dielectric layer, leaving the top gate spacers 224 on the sidewalls of the dummy gate stacks 220. In some embodiments, as depicted herein, the anisotropic etching is performed at a later processing step.

At operation 116, referring to FIGS. 1B and 13A-13D, method 100 forms S/D recesses 240 and 242 in the regions 202a and 202b, respectively, in an etching process 310. In the present embodiments, method 100 removes portions of the active regions 204a and 204b as well as portions of the cladding layer 213 without removing, or substantially removing, the dummy gate stacks 220, the dielectric layer 230, the dielectric helmet 232, and the isolation structures 214. In some embodiments, the etching process 310 employs a suitable etchant capable of removing the Si layers 206, the SiGe layers 205, and the SiGe layers 207. In some embodiments, the etching process 310 is a dry etching process implemented with radio-frequency (RF) pulsing using a suitable etchant such as a fluorine-containing gas (e.g., $CHF_3$, $CF_4$, $CH_3F$, $CH_2F_2$, $C_4F_8$, $C_4F_6$, other fluorine-containing gases, or combinations thereof), a bromine-containing gas (e.g., HBr), an inert gas, other suitable gases, or combinations thereof. A cleaning process may subsequently be performed to remove any etching by-products from the S/D recesses 240 and 242.

At operation 118, referring to FIGS. 1B and 14A-14D, method 100 removes portions of the SiGe layers 205 and 207 exposed in the S/D recesses 240 and 242 in an etching process 312. In the present embodiments, the etching process 312 is configured to selectively etch the SiGe layers without etching, or substantially etching, the Si layers 206 exposed in the S/D recesses 240 and 242. In other words, the etching process 312 removes the Ge-containing layers at a higher rate than those without any Ge content. As depicted herein, the etching process 312 results in trenches 244a formed in the SiGe layers 207 and trenches 244b in the SiGe layer 205, which includes less Ge than the SiGe layers 207.

In the present embodiments, the etching process 312 includes a dry etching process followed by a wet etching process. In some embodiments, the dry etching process is implemented with RF pulsing using a suitable etchant such as a fluorine-containing gas (e.g., $CHF_3$, $CF_4$, $CH_3F$, $CH_2F_2$, $C_4F_8$, $C_4F_6$, other fluorine-containing gases, or combinations thereof), a bromine-containing gas (e.g., HBr), an inert gas, other suitable gases, or combinations thereof. In some embodiments, the wet etching process is implemented with diluted hydrofluoric acid (e.g., dHF), hydrogen peroxide ($H_2O_2$), ammonium hydroxide ($NH_4OH$), hydrochloric acid (HCl), other suitable wet etchants, or combinations thereof. In some examples, the wet etchant may be a standard cleaning solution-1 (or SC-1), which includes $H_2O_2$, $NH_4OH$, and water, and/or a standard cleaning solution-2 (or SC-2), which includes $H_2O_2$, HCl, and water.

In the present embodiments, the selectivity of the etching process 312 toward Ge increases with increasing Ge content. In other words, because the SiGe layer 205 includes less Ge than the SiGe layers 207, the extent of etching in the SiGe layer 205 is less than that in the SiGe layer 207, resulting in a width W1 of the trenches 244a being greater than a width W2 of the trenches 244b. Accordingly, a length L1 of a remaining portion of each SiGe layer 207 is less than a length L2 of a remaining portion of the SiGe layer 205. As will be discussed in detail below, the widths W1 and W2 each corresponds to a thickness of an inner gate spacer formed between the metal gate stack and a S/D feature, and the lengths L1 and L2 each correspond to a gate length of the metal gate stack formed between the Si layers 206 within each ML. In this regard, the metal gate stack formed in the ML1 is defined by a uniform gate length, the length L1, between the Si layers 206, and the metal gate stack formed in the ML2 is defined by a relatively longer gate length, the length L2, between the substrate 202 and the bottommost Si layer 206, as well as by the length L1 between the remainder of the Si layers 206 over the bottommost Si layer 206. In some embodiments, a ratio of the gate length L2 to the gate length L1 is about 1.1 to about 1.6. In some examples, the gate length L1 may be about 10 nm to about 18 nm, the gate length L2 may be about 12 nm to about 20 nm, and the difference between them may be about 2 nm to about 6 nm.

Generally, nanosheet-based devices are formed with uniform gate length along a stacking direction of the ML. However, it may be beneficial for devices with different functions to have varying gate lengths, such that different aspects of device performance may be tuned or optimized for improvement. For example, in an SRAM cell, it may be desirable for pass-gate (PG) devices to have relatively longer gate length to reduce leakage associated with drain-induced barrier lowering (DIBL) effect, improve gate control, and increase threshold voltage, which leads to reduced current ($I_{on}$, PG) relative to pull-down (PD) and/or pull-up (PU) devices for enhanced performance in the memory device. The present disclosure is directed to NS FETs with varying gate lengths to allow functions of various devices formed on the same substrate to be tuned and optimized separately.

In the present embodiments, the ML1 provides devices having a uniform gate length and the ML2 provides devices with varying gate lengths, where the gate length L2 of the bottommost device is longer than the gate length L1 of the devices disposed thereover. In the present embodiments, the longer gate length L2 is provided in at least the bottommost device to improve gate control and reduce leakage issues. In some examples, the long gate length L2 may be additionally provided in at least one of the devices disposed thereover. In the present embodiments, a difference between the gate lengths L1 and L2 is achieved by adjusting the difference in the amount of Ge between the SiGe layers 205 and 207. In some embodiments, the amount of Ge in the SiGe layer 207 is greater than that in the SiGe layer 205 by about 1% to about 5%, where the difference of less than about 1% may not be sufficient to provide etching selectivity between the SiGe layers 205 and 207 and the difference of greater than about 5% may result in the trenches 244b to be too narrow to accommodate subsequent formation of the inner gate spacers. It is noted, however, that such difference may be greater than about 5%, so long as the resulting width W2 of the trenches 244b is large enough for forming the inner gate spacers to a desired thickness. In some embodiments, the amount of Ge in the SiGe layers 207 does not exceed about 50%. In some instances, if the amount of Ge in the SiGe layers 207 exceeds about 50%, structural defects may be introduced during the epitaxial growth of the SiGe layers 207, while an amount of Ge in the SiGe layers 207 that is less than about 23% may not present sufficient etching selectivity with respect to the SiGe layer 205 as discussed in detail above.

At operation 120, referring to FIGS. 1B and 15A-16D, method 100 forms inner gate spacers 248a on sidewalls of the recessed SiGe layers 207 and inner gate spacers 248b on sidewalls of the recessed SiGe layer 205. The inner gate spacers 248a and 248b may each be a single-layer structure or a multi-layer structure and may include silicon oxide, SiN, SiCN, SiOC, SiON, SiOCN, a low-k dielectric material, air, a high-k dielectric material (e.g., $HfO_2$, $La_2O_3$, etc.), other suitable dielectric material, or combination thereof. In some embodiments, the inner gate spacers 248a and 248b differ from the top gate spacers 224 in composition. In the present embodiments, the inner gate spacers 248a and 248b have the same compositions but differ in dimensions.

Forming the inner gate spacers 248a and 248b includes performing a series of deposition and etching processes. Referring to FIGS. 15A-15D, method 100 deposits one or more dielectric layers 246 along sidewalls of the S/D recesses 240 and 242, as well as the exposed sidewalls of the top gate spacers 224, thereby filling the trenches 244a and 244b. Subsequently, referring to FIGS. 16A-16D, method 100 removes (i.e., etches back) excess dielectric layer(s) deposited on surfaces of the Si layers 206 and the top gate spacers 224, thereby forming the inner gate spacers 248a and 248b. The one or more dielectric layers 246 may be deposited by any suitable method, such as ALD, CVD, physical vapor deposition (PVD), other suitable methods, or combinations thereof.

Accordingly, the inner gate spacers 248a are defined by the width W1 and the inner gate spacers 248b are defined by the width W2. As discussed in detail above, the difference in the widths W1 and W2 is attributed to the etching selectivity between the SiGe layers 205 and 207. In the present embodiments, the width W2 is at least about 1 nm to maintain a thickness of the inner gate spacers 248b capable of providing sufficient insulation between the subsequently-formed metal gate stack and the S/D feature. In some examples, the width W1 may be about 3 nm to about 6 nm, the width W2 may be about 1 nm to about 5 nm, and the difference between them may be about 1 nm to about 3 nm.

At operation 122, referring to FIGS. 1B and 17A-17D, method 100 forms S/D features 250 and 252 in the S/D recesses 240 and 242, respectively. Each of the S/D features 250 and 252 may be suitable for forming a p-type FET (i.e., including a p-type epitaxial material) or, alternatively, an n-type FET (i.e., including an n-type epitaxial material). The p-type epitaxial material may include one or more epitaxial layers of silicon germanium (epi SiGe) each doped with a p-type dopant such as B, $BF_2$, other p-type dopants, or combinations thereof. The n-type epitaxial material may include one or more epitaxial layers of silicon (epi Si) or silicon carbon (epi SiC) each doped with an n-type dopant such as As, P, other n-type dopants, or combinations thereof.

In the present embodiments, forming the S/D features 250 and 252 includes growing an epitaxial semiconductor material in each of the S/D recess 240 and 242 and over the inner gate spacers 248a and 248b in a process similar to that discussed above with respect to forming the SiGe layer 205. In some embodiments, the epitaxial semiconductor material is doped in-situ by adding a dopant species discussed above to a source material during the epitaxial growth process. In some embodiments, the epitaxial semiconductor material is doped by an ion implantation process after performing the deposition process. In some embodiments, an annealing process is performed to activate the dopant species in the S/D features 250 and 252. In some embodiments, each of the S/D features 250 and 252 includes one doped epitaxial semiconductor material. In some embodiments, each of the S/D features 250 and 252 includes multiple doped epitaxial semiconductor materials that differ in the amount of dopant present.

At operation 124, referring to FIGS. 1B and 18A-18D, method 100 forms metal gate stacks in place of the dummy gate stacks 220 (and the interfacial layer 221), the SiGe layer 205, and the SiGe layers 207. In the present embodiments, method 100 forms a metal gate stack 260 over the region 202a and a metal gate stack 262 over the region 202b, such that the metal gate stack 260 engages with the active region 204a to form an NS FET 300 and the metal gate stack 262 engages with the active region 204b to form an NS FET 400. In some embodiments, the NS FETs 300 and 400 are devices of the same conductivity type, i.e., both are NFETs; though they may be configured as different devices in a memory cell (e.g., an SRAM cell). In some embodiments, the NS FETs 300 and 400 are devices of different conductivity types, i.e., one is an NFET and the other one is a PFET.

Method 100 first forms an etch-stop layer (ESL) 256 over the structure 200 to protect the underlying components, such as the S/D features 250 and 252, during subsequent fabrication processes. The ESL 256 may include any suitable dielectric material, such as SiN, SiCN, SiON, $Al_2O_3$, other suitable materials, or combinations thereof, and may be formed by CVD, ALD, PVD, other suitable methods, or combinations thereof. In the present embodiments, the ESL 256 provides etching selectivity with respect to its surrounding dielectric components to ensure protection against inadvertent damage.

Subsequently, method 100 forms an interlayer dielectric (ILD) layer 258 over the ESL 256, thereby filling the space between adjacent dummy gate stacks 220. The ILD layer 258 may include silicon oxide, a low-k dielectric material, TEOS, a doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate stacks 220.

Method 100 then removes the dummy gate stacks 220 from the structure 200 to form gate trenches (not depicted) in an etching process. In the present embodiments, method 100 selectively removes the dummy gate stacks 220 (including the interfacial layer 221) without removing, or substantially removing, the Si layers 206 and the surrounding dielectric components. The etching process may include any suitable process, such as a dry etching process, a wet etching process, an RIE, or combinations thereof.

In some embodiments, though not depicted herein, method 100 optionally patterns the dielectric helmet 232 remaining over the channel regions of the active regions 204a and 204b to form gate isolation features for separating the subsequently-formed metal gate stack. The patterning process may include forming a patterned masking element over the structure 200 to expose portions of the dummy gate stacks 220, removing the exposed portions of the dummy gate stacks 220, thereby exposing portions of the underlying dielectric helmet 232, and removing the exposed portions of the dielectric helmet 232. After removing the patterned masking element, the remaining portions of the dielectric helmet 232 become the gate isolation features for the subsequently-formed metal gate stacks 260. In alternative embodiments, as will be discussed in detail below, the dielectric helmet 232 are removed in its entirety at a subsequent operation and gate isolation features are formed separately after forming the metal gate stack.

Subsequently, method 100 removes the SiGe layers 205 and the SiGe layers 207 from the MLs to form openings (not depicted) between the Si layers 206 in a sheet formation, or sheet release, process. In the present embodiments, the sheet formation process further removes the remaining cladding layer 213. In some embodiments, the sheet formation process is implemented in a series of etching and trimming processes. In one example, a wet etching process employing an oxidant (or oxidizer) such as ozone ($O_3$; dissolved in water), nitric acid ($HNO_3$), $H_2O_2$, other suitable oxidants, and a fluorine-based etchant such as HF, ammonium fluoride ($NH_4F$), other suitable etchants, or combinations thereof may be performed during the sheet formation process.

Thereafter, still referring to FIGS. 18A-18D, method 100 forms the metal gate stacks 260 and 262 over the structure 200, wherein the metal gate stack 260 includes a first portion 260a formed in the gate trenches and a second portion 260b formed adjacent to the inner gate spacers 248a, and the metal gate stack 262 includes a first portion 262a formed in the gate trenches, a second portion 262b formed adjacent to the inner gate spacers 248a, and a third portion 262c formed adjacent to the inner gate spacers 248b. Accordingly, referring to FIGS. 18A and 18B, the second portion 260b of the metal gate stack 260 and the second portion 262b of the metal gate stack 262 are each defined by the gate length L1 and the third portion 262c of the metal gate stack 262 is defined by the gate length L2, which is greater than the gate length L1. As discussed above, the difference in the gate lengths L1 and L2 is attributed to the etching selectivity between the SiGe layers 205 and 207.

In some embodiments, though not depicted, the metal gate stacks 260 and 262 each include an interfacial layer, a gate dielectric layer over the interfacial layer, and a metal gate electrode over the gate dielectric layer. Composition of the interfacial layer may be similar to that of the interfacial layer 221. In some embodiments, the gate dielectric layer includes a high-k dielectric material, such as $HfO_2$, $La_2O_3$, other suitable materials, or combinations thereof, and the metal gate electrode includes at least one work function metal layer (not depicted separately) and a bulk conductive layer (not depicted separately) disposed thereover. The work function metal layer may be a p-type or an n-type work function metal layer. Example work function metals include TiN, TaN, WN, ZrSi$_2$, MoSi$_2$, TaSi$_2$, NiSi$_2$, Ti, TaAl, TaAlC, TiAlN, TaC, TaCN, TaSiN, Mn, Zr, other suitable work function metals, or combinations thereof. In some examples where the metal gate stacks 260 and 262 are configured to form FETs of different conductivity types, the work function metals included in the metal gate stack 260 may differ from those included in the metal gate stack 262. The bulk conductive layer may include copper (Cu), tungsten (W), aluminum (Al), cobalt (Co), ruthenium (Ru), other suitable materials, or combinations thereof. The metal gate stacks 260 and 262 each may further include other material layers (not depicted), such as a capping layer, a barrier layer, other suitable layers, or combinations thereof. Various layers of the metal gate stacks 260 and 262 may be formed by various methods, including chemical oxidation, thermal oxidation, ALD, CVD, PVD, plating, other suitable methods, or combinations thereof. After forming the bulk conductive layer, one or more CMP processes are performed to remove excessive material formed on top surface of the ILD layer 258, thereby planarizing the structure 200.

Figure 19A:
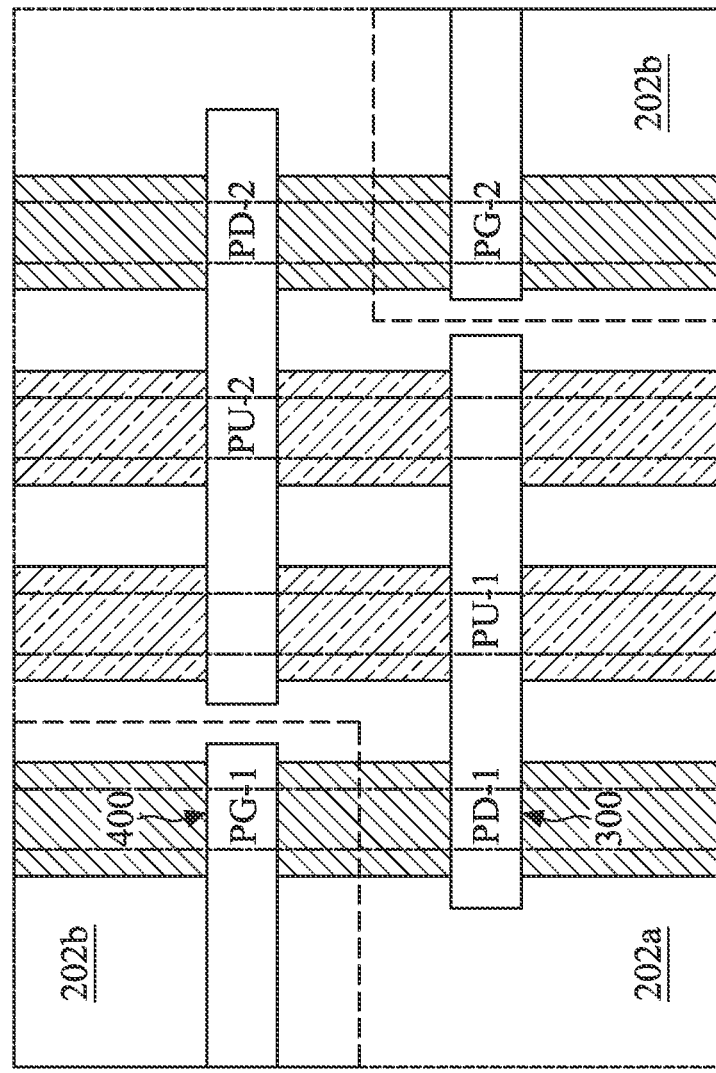
FIGS. 19A and 19B are planar top views of an example IC layout according to various embodiments of the present disclosure.
Figure 19B:
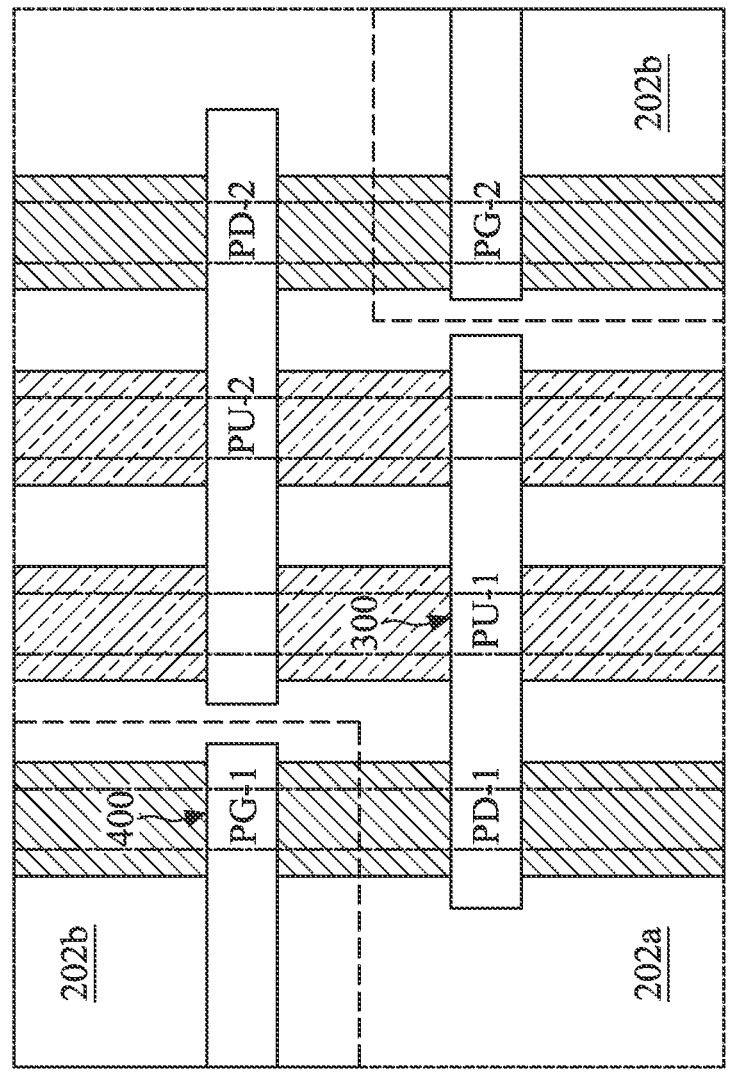

FIGS. 19A and 19B each depict an example embodiment of the structure 200 that provides the NS FET 300 formed in the region 202a and the NS FET 400 formed in the region 202b. As discussed above, PG devices in an SRAM cell may benefit from increased gate lengths, such as that of the NS FET 400 depicted in FIG. 18B, relative to PD and/or PU devices. Generally, readability (or read margin) of an SRAM cell is related to a ratio ($\beta$ ratio) of the current of the PD device ($I_{on}$, PD) and the current of the PG device ($I_{on}$, PG), and writability (or write margin) of the SRAM cell is related to a ratio (a ratio) of the current of the PU device ($I_{on}$, PU) and $I_{on}$, PG, where the current is generally inversely related to the gate length of each device. In this regard, independently adjusting the gate length of each device in the cell may offer design flexibility in improving the writability and/or the readability of the SRAM cell. For example, referring to FIG. 19A, the NS FET 300 may be a PD device having the relatively shorter gate length L1 and a higher $I_{on}$, PD compared to the NS FET 400, which may be a PG device having the relatively longer gate length L2 and a lower $I_{on}$, PG, which together results in an increased $\beta$ ratio. In another example, referring to FIG. 19B, the NS FET 300 may be a PU device having the relatively shorter gate length L1 and a higher $I_{on}$, PU compared to the NS FET 400, which may be a PG device having the relatively longer gate length L2 and a lower current $I_{on}$, PG, which together results in an increased α ratio. Accordingly, the present embodiments provide methods of configuring various devices in the SRAM cell with different gate lengths to allow different aspects of the device performance to be improved independently.

Thereafter, method 100 at operation 126 performs additional fabrication processes to the structure 200, such as forming various device-level contacts (e.g., S/D contacts and/or gate contacts; not depicted) and a multi-layer interconnect (MLI) structure (not depicted) thereover. The S/D contacts may include Co, W, Ru, Cu, Al, titanium (Ti), nickel (Ni), gold (Au), platinum (Pt), palladium (Pd), other suitable metals, or combinations thereof. The S/D contacts may include a metal silicide layer over the S/D features 250 and/or 252, a barrier layer over the metal silicide layer, and a metal fill layer over the barrier layer, where the barrier layer may include Ti, TiN, Ta, TaN, WN, other suitable materials, or combinations thereof. The MLI may include various interconnect features, such as vias and conductive lines, disposed in dielectric layers, such as ESLs and ILD layers. In some embodiments, the vias are vertical interconnect features configured to interconnect a device-level contact with a conductive line or interconnect different conductive lines, which are horizontal interconnect features. The ESLs and the ILD layers of the MLI may have substantially same compositions as those discussed above with respect to the ESL 256 and the ILD layer 258, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises Ti, TiN, Ta, TaN, WN, other suitable materials, or combinations thereof.

Although not intended to be limiting, one or more embodiments of the present disclosure provide many benefits to a semiconductor device and the formation thereof. For example, the present disclosure provides NS FETs with tunable gate lengths to provide more flexibility in optimizing performance of memory cells (such as SRAM cells). In the present embodiments, tuning the NS FETs to have different gate lengths includes changing concentration of Ge in different SiGe layers provided in an ML and recessing the SiGe layers after forming the S/D recesses. In the present embodiments, differences in the concentration of Ge leads to the different SiGe layers to be recessed to different depths, leading to different gate lengths as well as inner spacers of different thicknesses. In some embodiments, a lower concentration of Ge leads to less extent of recessing and thus a longer gate length. With respect to SRAM cells, the present embodiments provide methods of independent adjusting gate lengths of various devices for purposes of improving the readability and/or writability of the cells. In addition, the present embodiments provide methods of forming NS FETs that allow functions of various devices formed on the same substrate to be tuned and optimized separately. Embodiments of the disclosed methods can be readily integrated into existing processes and technologies for manufacturing NS FETs.

In one aspect, the present disclosure provides a method that includes providing a substrate having a first region and a second region and subsequently forming a fin protruding from the first region of the substrate, where the fin includes a first SiGe layer and a stack alternating Si layers and second SiGe layers disposed over the first SiGe layer and the first SiGe layer has a first concentration of Ge and each of the second SiGe layers has a second concentration of Ge that is greater than the first concentration. The method further includes recessing the fin to form an S/D recess, recessing the first SiGe layer and the second SiGe layers exposed in the S/D recess, where the second SiGe layers are recessed more than the first SiGe layer, and forming an S/D feature in the S/D recess. The method further includes removing the recessed first SiGe layer and the second SiGe layers to form openings and then forming a metal gate structure over the fin and in the openings.

In another aspect, the present disclosure provides a method that includes forming a first SiGe layer over a substrate that has a first region and a second region, treating the first SiGe layer to form a second SiGe layer in the second region relative to the first region, where the second SiGe layer includes a greater amount of Ge than the first SiGe layer, forming a stack of alternating Si layers and the second SiGe layers over the treated first SiGe layer, and subsequently patterning to form a fin from the stack and the first SiGe layer. The method further includes forming an S/D recess in the fin to expose the first SiGe layer and the second SiGe layers, etching the exposed first SiGe layer and the second SiGe layers to form first trenches and second trenches, respectively, where the first trenches are narrower than the second trenches, and forming an S/D feature in the S/D recess. The method further includes removing remaining portions of the first SiGe layer and the second SiGe layers to form openings and then forming a metal gate structure in the openings.

In yet another aspect, the present disclosure provides a semiconductor structure that includes a stack of semiconductor layers disposed over a substrate and a metal gate stack interleaved with the stack of semiconductor layers, where a first portion of the metal gate stack disposed between a first semiconductor layer and a second semiconductor layer of the stack has a first length, a second portion of the metal gate stack disposed between the second semiconductor layer and a third semiconductor layer of the stack has a second length, and the first length is greater than the second length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a substrate having a first region and a second region;
    forming a fin protruding from the first region of the substrate, wherein the fin includes a first SiGe layer and a stack of alternating Si layers and second SiGe layers disposed over the first SiGe layer, and wherein the first SiGe layer has a first concentration of Ge and each of the second SiGe layers has a second concentration of Ge that is greater than the first concentration;
    recessing the fin to form a source/drain (S/D) recess;
    recessing the first SiGe layer and the second SiGe layers exposed in the S/D recess in a same lateral etching process, wherein the second SiGe layers are laterally recessed more than the first SiGe layer due to each of the second SiGe layers having the second concentration of Ge that is greater than the first concentration;
    forming an S/D feature in the S/D recess;
    removing the recessed first SiGe layer and the second SiGe layers to form openings; and
    forming a metal gate structure over the fin and in the openings.

2. The method of claim 1, wherein forming the fin includes:
    forming the first SiGe layer over the first region and the second region of the substrate;
    treating the first SiGe layer in the second region but not in the first region, wherein the treating of the first SiGe layer converts the first SiGe layer in the second region into a third SiGe layer having the second concentration of Ge;
    alternatingly forming the Si layers and the second SiGe layers over the first SiGe layer and the third SiGe layer to form the stack having a first portion over the first SiGe layer and a second portion over the third SiGe layer; and
    patterning the stack to form the fin having the first portion protruding from the first region and the second portion protruding from the second region.

3. The method of claim 2, wherein treating the first SiGe layer includes selectively implanting Ge in the second region relative to the first region.

4. The method of claim 2, wherein treating the first SiGe layer includes:
    selectively removing the first SiGe layer from the second region relative to the first region;
    depositing the third SiGe layer over a remaining portion of the first SiGe layer in the first region and over the second region; and
    selectively removing the deposited third SiGe layer from the first region relative to the second region, such that a portion of the third SiGe layer remains in the second region.

5. The method of claim 1, wherein a difference between the first concentration and the second concentration is about 1% to about 5%.

6. The method of claim 1, wherein the first concentration of Ge is about 20% to about 22%.

7. The method of claim 1, further comprising, before forming the S/D feature, forming a first inner spacer on a sidewall of the first SiGe layer exposed in the S/D recess and a second inner spacer on a sidewall of one of the second SiGe layers exposed in the S/D recess, wherein a thickness of the first inner spacer is less than a thickness of the second inner spacer.

8. The method of claim 1, wherein a portion of the metal gate structure that replaces the first SiGe layer has a first length and a portion of the metal gate structure that replaces the second SiGe layer has a second length, and wherein the first length is greater than the second length.

9. A method, comprising:
    forming a first SiGe layer over a substrate, wherein the substrate includes a first region and a second region;
    treating the first SiGe layer to form a second SiGe layer in the second region relative to the first region, wherein the second SiGe layer includes a greater amount of Ge than the first SiGe layer;
    forming a stack of alternating Si layers and third SiGe layers over the first SiGe layer and the second SiGe layer, the third SiGe layers having a greater amount of Ge than the first SiGe layer;
    forming a fin from the stack and the first SiGe layer;
    forming a source/drain (S/D) recess in the fin to expose the first SiGe layer and the third SiGe layers;
    etching the exposed first SiGe layer and the third SiGe layers to form first trenches and second trenches, respectively, wherein the first trenches are narrower than the second trenches;
    forming an S/D feature in the S/D recess;
    removing remaining portions of the first SiGe layer and the third SiGe layers to form openings; and
    forming a metal gate structure in the openings.

10. The method of claim 9, wherein treating the first SiGe layer includes doping Ge in the second region but not in the first region.

11. The method of claim 9, wherein treating the first SiGe layer includes:

selectively removing a portion of the first SiGe layer from the second region;

depositing the second SiGe layer over a remaining portion of the first SiGe layer in the first region and over the second region; and selectively removing a portion of the second SiGe layer from the first region relative to the second region, such that a portion of the second SiGe layer remains in the second region.

12. The method of claim 9, wherein a difference in the amount of Ge between the first SiGe layer and the second SiGe layer is about 2% to about 5%.

13. The method of claim 9, further comprising, before forming the S/D feature, forming a first inner spacer to fill each first trench and a second inner spacer to fill each second trench, wherein a thickness of the first inner spacer is less than a thickness of the second inner spacer.

14. A method, comprising:

forming a first SiGe layer over first and second regions of a substrate;

selectively removing the first SiGe layer over the first region while the first SiGe layer over the second region remains;

depositing a second SiGe layer over the first and second regions of the substrate;

selectively removing the second SiGe layer over the second region while the second SiGe layer over the first region remains;

forming a semiconductor stack by forming a stack of alternating Si layers and SiGe layers over the second SiGe layer in the first region and the first SiGe layer in the second region;

forming a fin from the semiconductor stack;

forming a source/drain (S/D) recess in the fin to expose side surfaces of the first SiGe layer, the second SiGe layer, and the stack of alternating Si layers and SiGe layers;

etching the exposed side surfaces of the first SiGe layer, the second SiGe layer, and the stack of alternating Si layers and SiGe layers to form spacer recesses, wherein the second SiGe layer is etched at a faster rate than the first SiGe layer;

forming inner spacers in the spacer recesses; and forming an S/D feature in the S/D recess.

15. The method of claim 14, wherein the second SiGe layer has a greater concentration of germanium than that of the first SiGe layer.

16. The method of claim 14, wherein each SiGe layers in the stack of alternating Si layers and SiGe layers have a greater concentration of germanium than that of the first SiGe layer.

17. The method of claim 14, wherein the first SiGe layer has a first concentration of germanium, wherein the second SiGe layer and each SiGe layers in the stack of alternating Si layers and SiGe layers have a second concentration of germanium, and the second concentration is greater than the first concentration.

18. The method of claim 14, further comprising:

removing remaining portions of the first SiGe layer, the second SiGe layer, and the SiGe layers in the stack of alternating Si layers and SiGe layers to form openings; and forming a metal gate structure in the openings.

19. The method of claim 18, wherein in the first region, the metal gate structure includes a bottommost portion having a first width and portions over the bottommost portion having a second width, and the first width is the same as the second width.

20. The method of claim 19, wherein in the second region, the metal gate structure includes a bottommost portion having a third width and portions over the bottommost portion having a fourth width, and the third width is greater than the fourth width.

* * * * *